United States Patent
Busch et al.

(10) Patent No.: US 9,455,510 B2
(45) Date of Patent: Sep. 27, 2016

(54) ATTACHMENT HAVING A MODULE AND AN ELECTRONICS ATACHMENT

(71) Applicant: Weidmueller Interface GmbH & Co. KG, Detmold (DE)

(72) Inventors: Gerald Busch, Lage (DE); Safwan Saltajl, Braunschweig (DE); Sascha Dreifert, Paderborn (DE)

(73) Assignee: Weidmueller Interface GmbH & Co. KG, Detmold (DE)

( * ) Notice: Subject to any disclaimer, the term of this patent is extended or adjusted under 35 U.S.C. 154(b) by 0 days.

(21) Appl. No.: 14/649,177

(22) PCT Filed: Jan. 13, 2014

(86) PCT No.: PCT/EP2014/050432
§ 371 (c)(1),
(2) Date: Jun. 2, 2015

(87) PCT Pub. No.: WO2014/111323
PCT Pub. Date: Jul. 24, 2014

(65) Prior Publication Data
US 2015/0333423 A1    Nov. 19, 2015

(30) Foreign Application Priority Data

Jan. 15, 2013   (DE) .................... 20 2013 100 208 U

(51) Int. Cl.
*H01R 25/14*    (2006.01)
*H01R 12/70*    (2011.01)
(Continued)

(52) U.S. Cl.
CPC ........ *H01R 12/7076* (2013.01); *H01R 13/633* (2013.01); *H01R 25/162* (2013.01); *H05K 7/1469* (2013.01)

(58) Field of Classification Search
CPC ............ H01R 12/7076; H01R 13/633; H01R 25/162; H05K 7/1469
USPC .................... 439/78, 110, 121, 532, 716, 638
See application file for complete search history.

(56) References Cited

U.S. PATENT DOCUMENTS 3,992,654 A  *  11/1976  Springer ............ H01R 12/7005
                                                     361/679.01
4,468,547 A  *   8/1984  Belttary ................. H01H 71/08
                                                          200/294

(Continued)

FOREIGN PATENT DOCUMENTS

AT              402 866 B      9/1997
DE         195 15 923 A1      11/1996
(Continued)

*Primary Examiner* — Abdullah Riyami
*Assistant Examiner* — Nelson R Burgos-Guntin
(74) *Attorney, Agent, or Firm* — Lawrence E. Laubscher, Sr.; Lawrence E. Laubscher, Jr.; Robert D. Spendlove

(57) ABSTRACT

An adapter arrangement for electrically connecting an upwardly directed first contact on a horizontal printed circuit board assembly with a generally upwardly directed second contact on an electronics module mounted on the PCB assembly, including a rigid adapter housing adapted for mounting on one end of the module, which housing contains a generally vertical conductor having a lower end connected by a downwardly directed lower terminal with the PCB assembly first contact, and an upper end connected by a generally downwardly-directed upper terminal with the electronics module second contact, characterized in that the lower adapter terminal is vertical, and the upper adapter terminal is downwardly inclined by an acute angle relative to the vertical. In a second embodiment, the adapter is sectional and includes upper and lower sections. In a third embodiment, an auxiliary adapter section is connected between the upper adapter section and the electronics module.

16 Claims, 22 Drawing Sheets

(51) Int. Cl.
*H01R 25/16* (2006.01)
*H01R 13/633* (2006.01)
*H05K 7/14* (2006.01)

(56) References Cited

U.S. PATENT DOCUMENTS

| | | | | |
|---|---|---|---|---|
| 5,043,847 | A * | 8/1991 | Deinhardt | H05K 7/1469 361/725 |
| 5,253,140 | A * | 10/1993 | Inoue | H05K 7/1468 16/429 |
| 5,810,618 | A * | 9/1998 | Barbier | H02B 1/052 439/532 |
| 6,172,877 | B1 * | 1/2001 | Feye-Hohmann | G06F 1/184 361/728 |
| 6,371,435 | B1 * | 4/2002 | Landis | H02B 1/052 248/694 |
| 6,409,538 | B1 * | 6/2002 | Yatskov | H01R 12/7005 439/567 |
| D464,326 | S * | 10/2002 | Clark | D13/162 |
| 6,923,680 | B2 * | 8/2005 | Dumont | H01R 9/2416 439/582 |
| 6,937,461 | B1 * | 8/2005 | Donahue, IV | H01R 13/514 174/50 |
| 7,101,188 | B1 * | 9/2006 | Summers | H01R 12/725 439/59 |
| D548,193 | S * | 8/2007 | Sandgren | D13/162 |
| 7,414,856 | B2 * | 8/2008 | Sandgren | H05K 7/1461 361/727 |
| 7,520,776 | B2 * | 4/2009 | Wagener | H02B 1/21 439/532 |
| 7,666,005 | B2 * | 2/2010 | Heggemann | H05K 7/1469 361/730 |
| 7,704,102 | B2 * | 4/2010 | Nad | H01R 9/26 439/221 |
| D616,833 | S * | 6/2010 | Heggemann | D13/164 |
| D616,834 | S * | 6/2010 | Heggemann | D13/164 |
| 7,736,161 | B2 * | 6/2010 | Heggemann | H01R 9/2625 439/157 |
| 8,011,951 | B2 * | 9/2011 | Moore | H02B 1/052 439/532 |
| 8,602,816 | B2 * | 12/2013 | Donhauser | H01R 13/516 439/532 |
| 8,867,187 | B2 * | 10/2014 | Dick | H02J 3/38 340/538 |
| 8,961,201 | B2 * | 2/2015 | Griese | H01R 9/2658 439/121 |
| 9,137,919 | B2 * | 9/2015 | Dorfer | H05K 7/1432 |
| 2010/0254096 | A1 | 10/2010 | Kim et al. | |

FOREIGN PATENT DOCUMENTS

| | | |
|---|---|---|
| DE | 197 10 768 A1 | 9/1998 |
| DE | 20 2006 006 615 U1 | 10/2006 |
| DE | 20 2007 011 112 U1 | 12/2007 |
| DE | 10 2010 016 856 A1 | 11/2011 |
| DE | 10 2010 046 990 A1 | 4/2012 |
| DE | 10 2011 001 274 A1 | 9/2012 |
| EP | 1 520 330 B1 | 8/2008 |

* cited by examiner

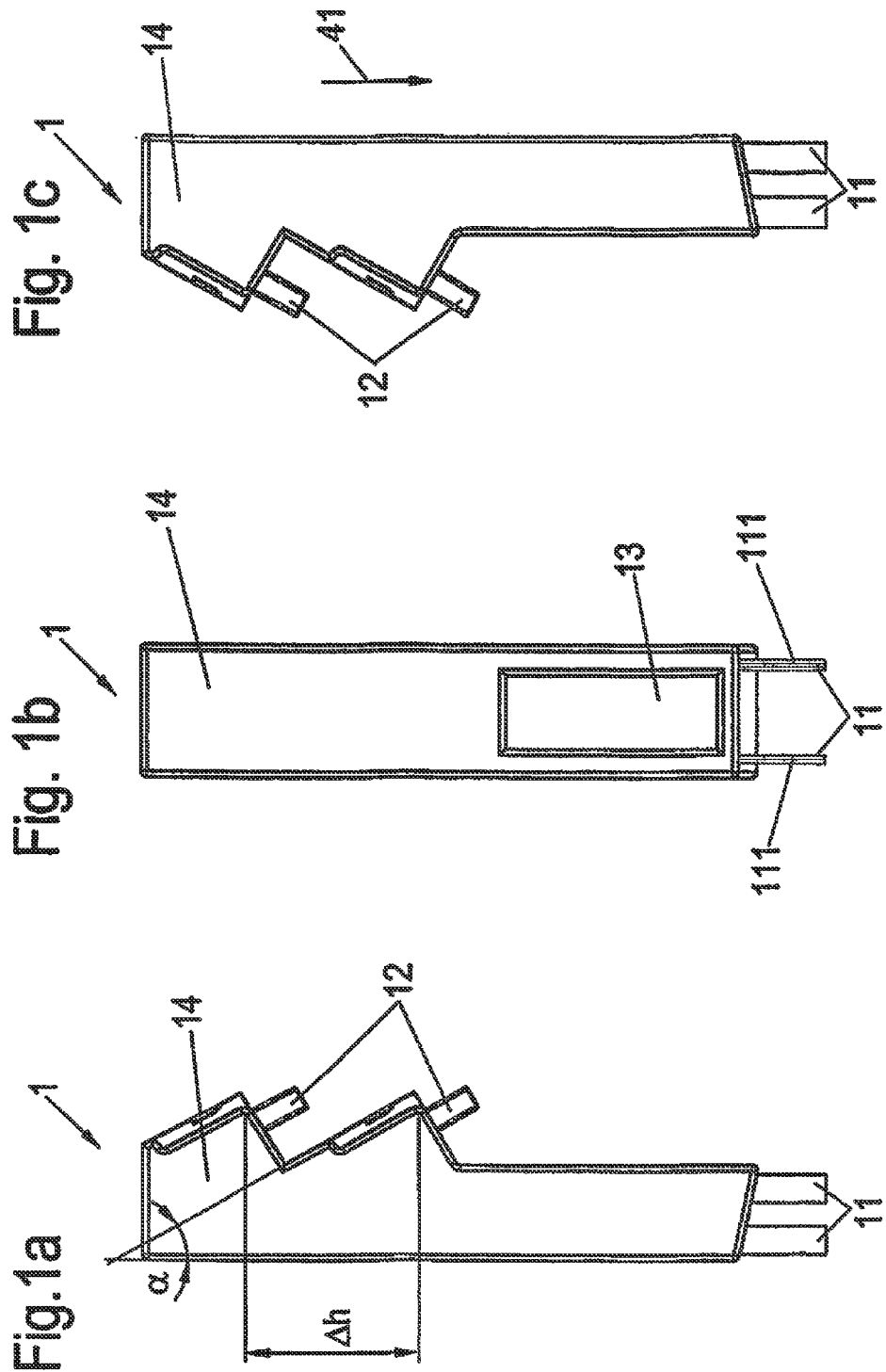

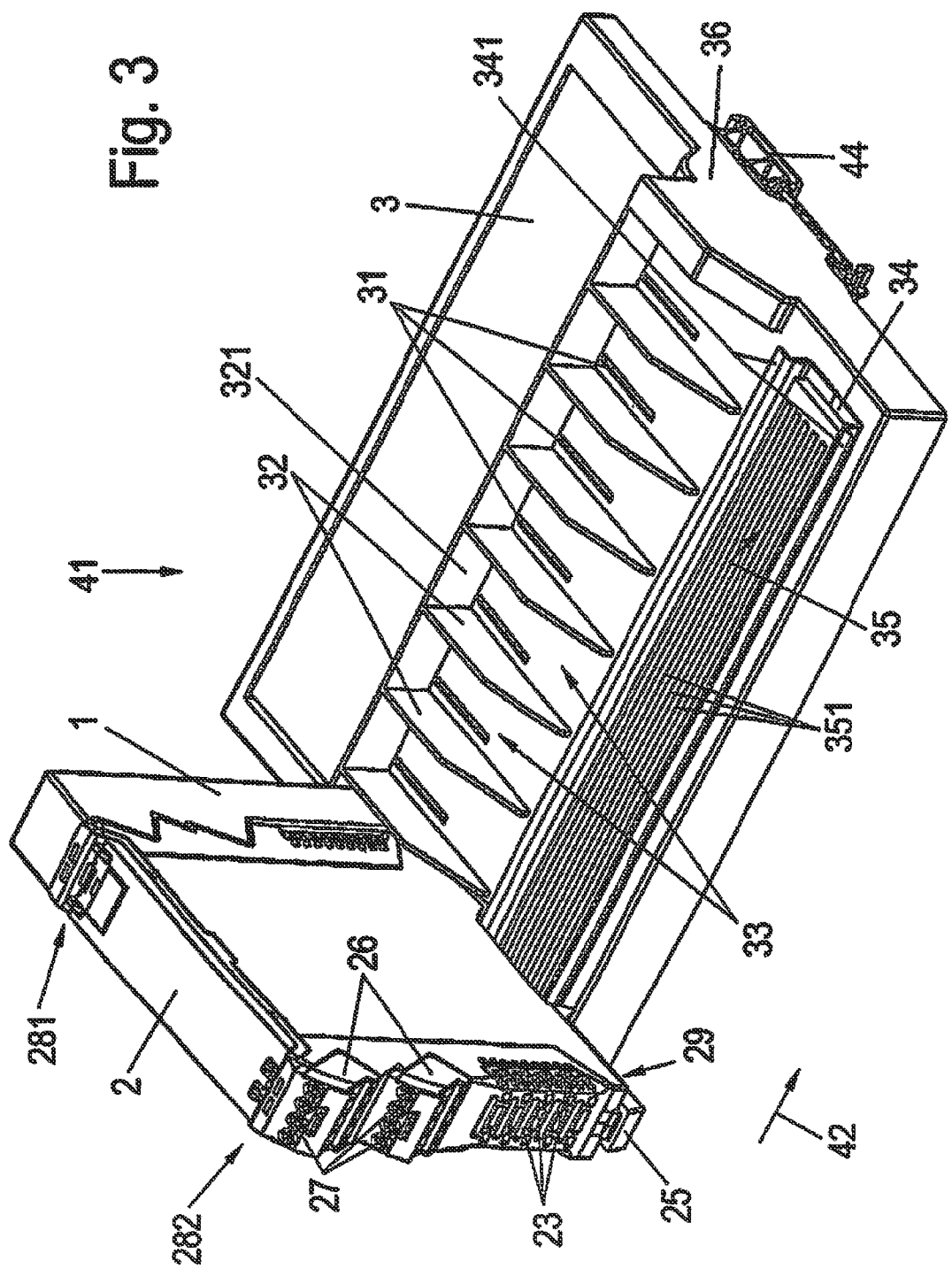

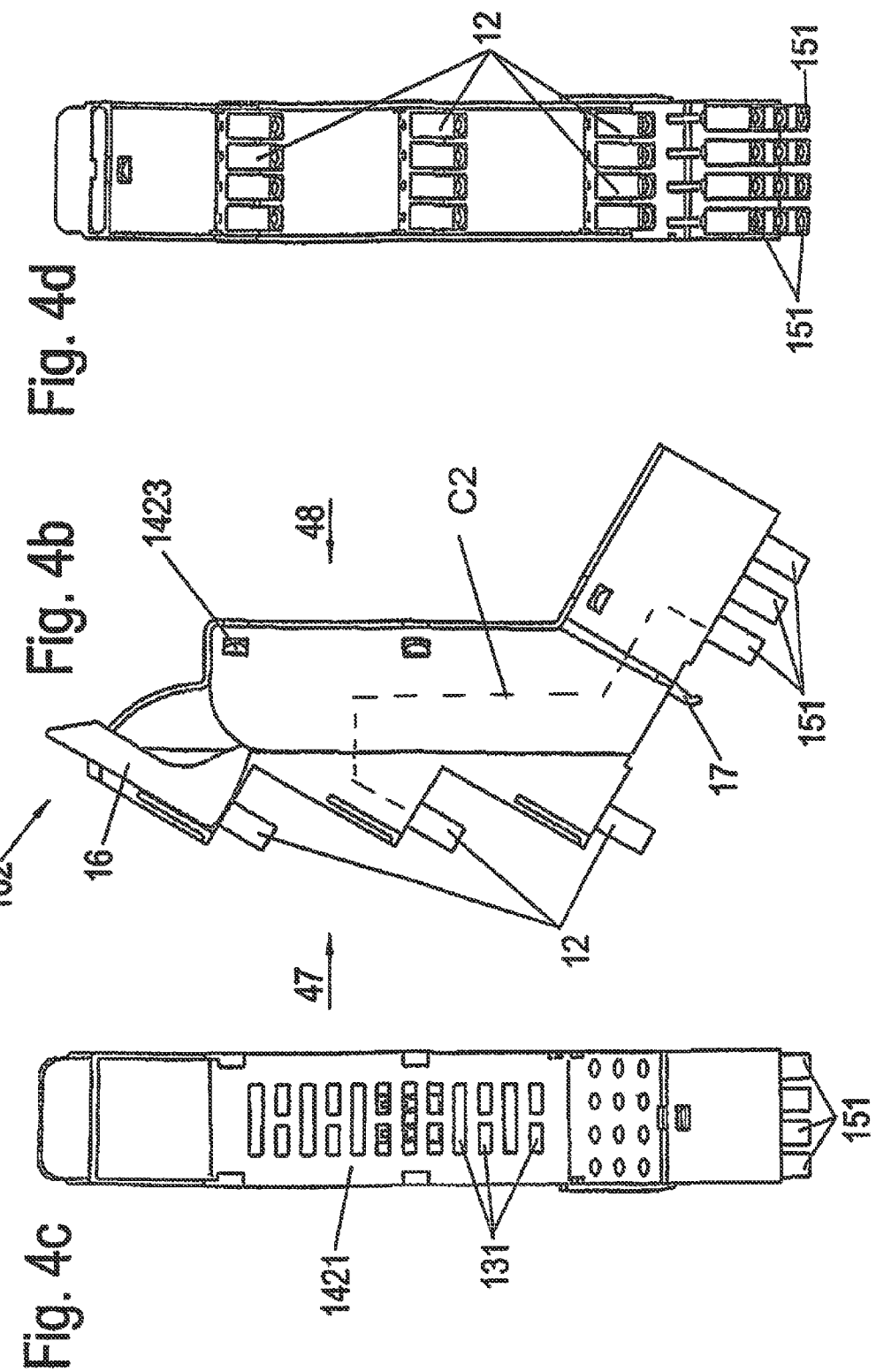

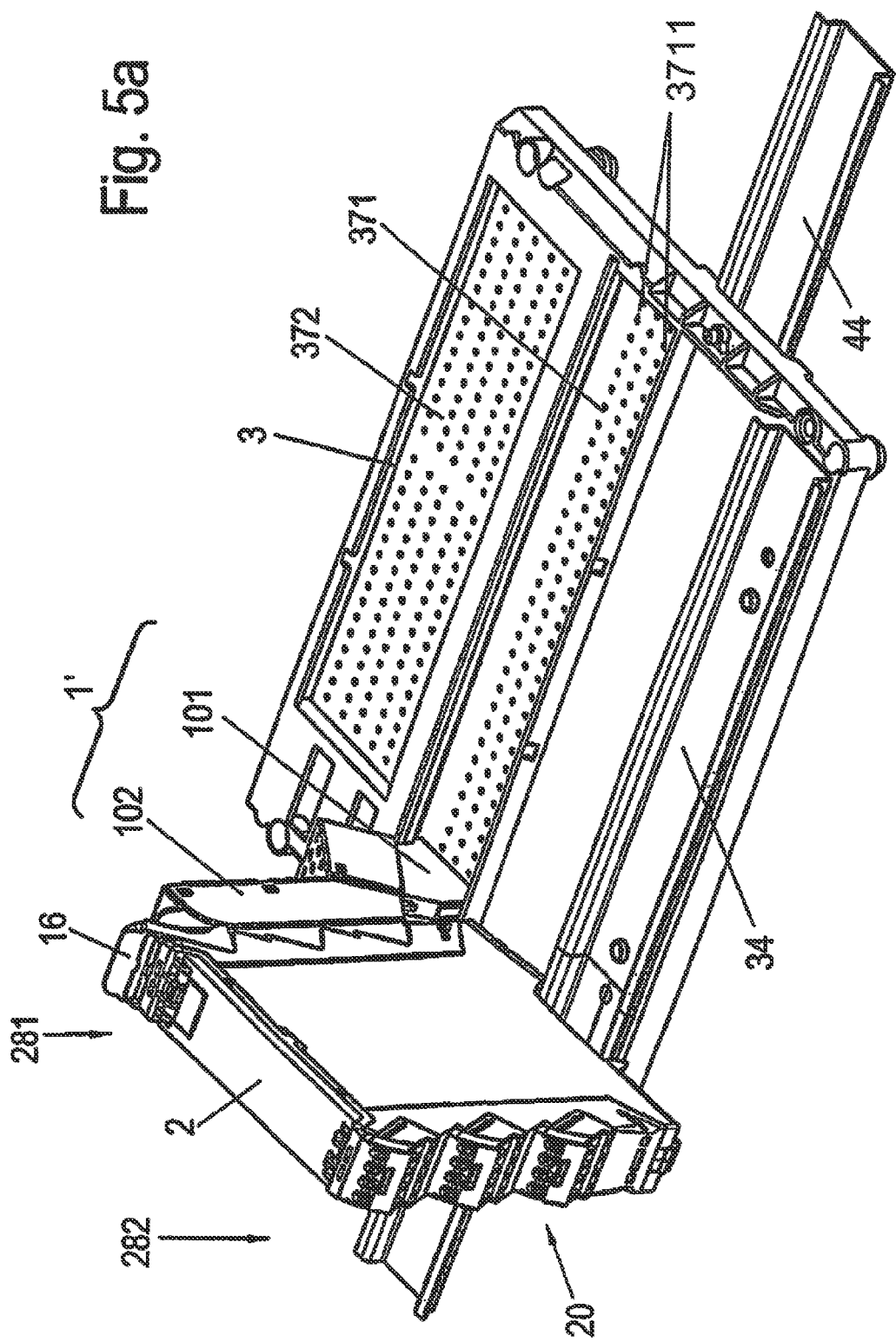

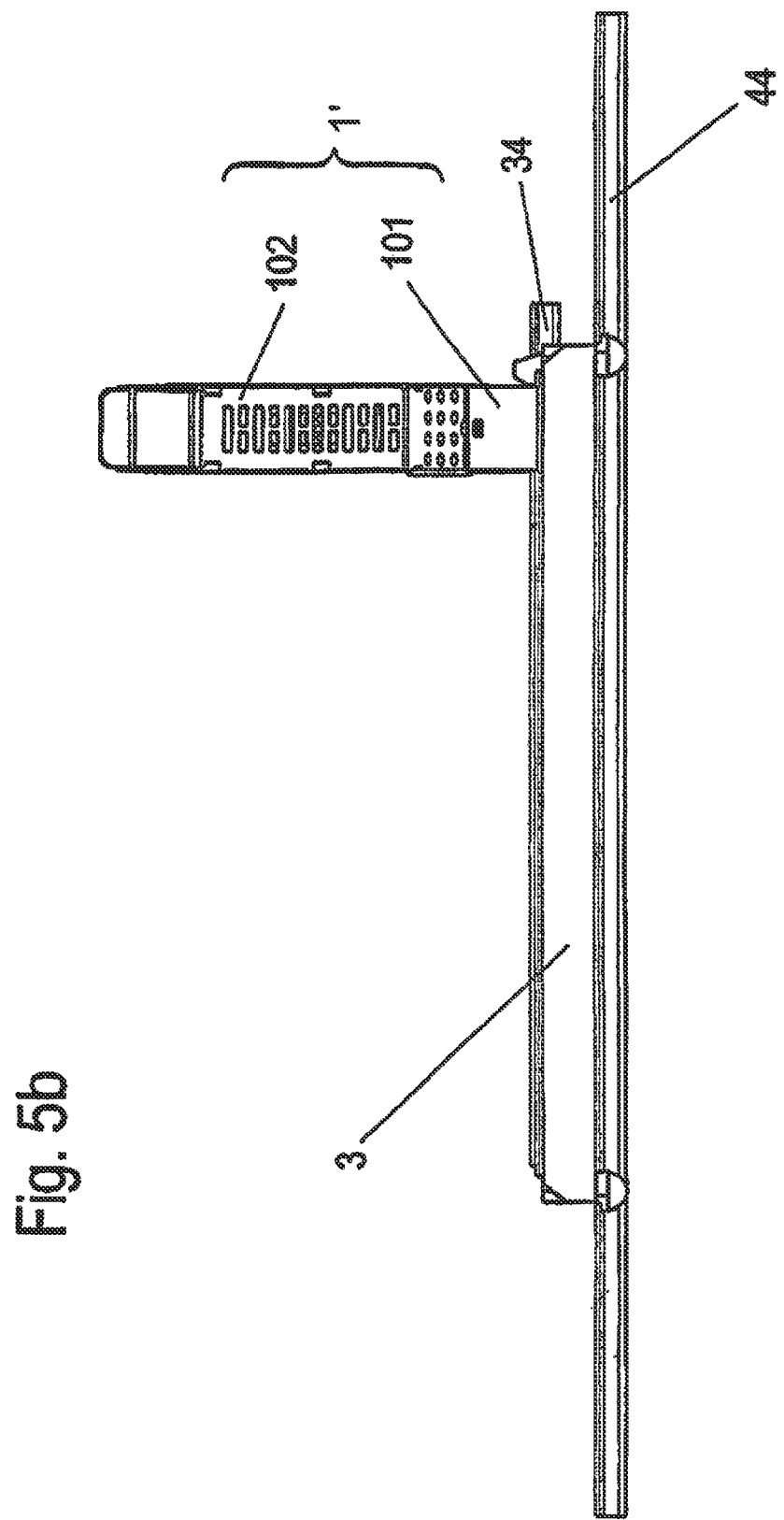

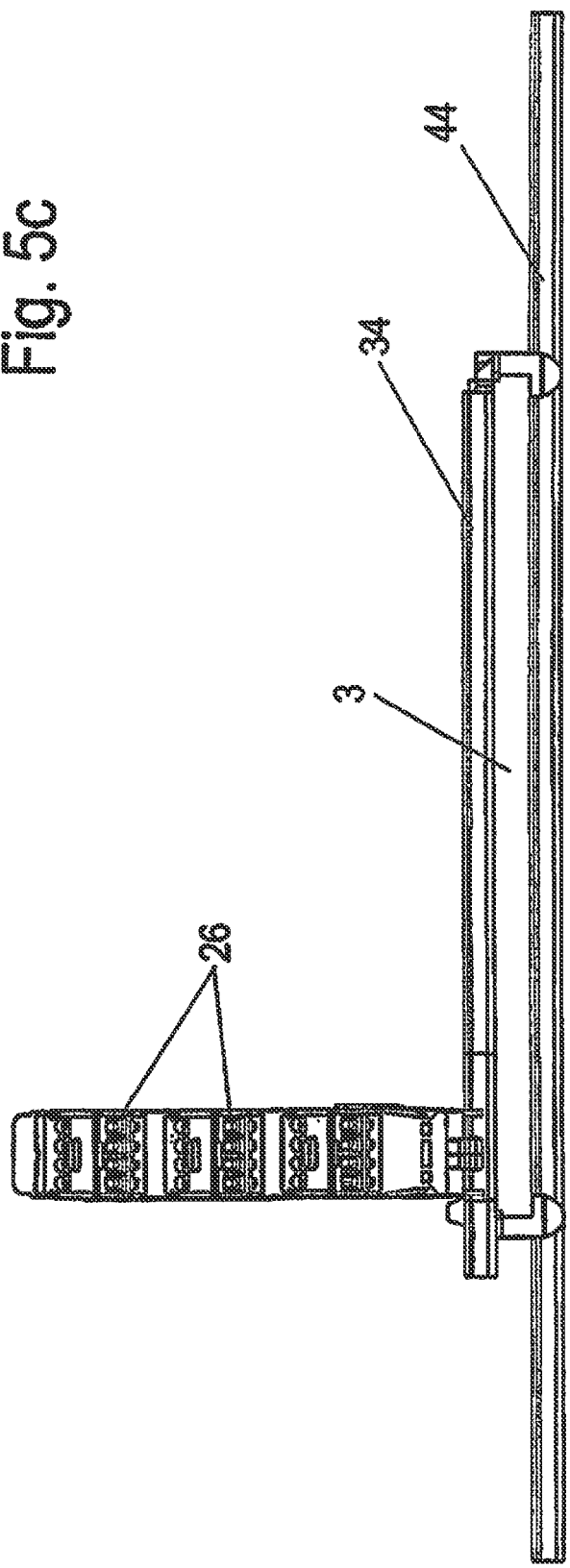

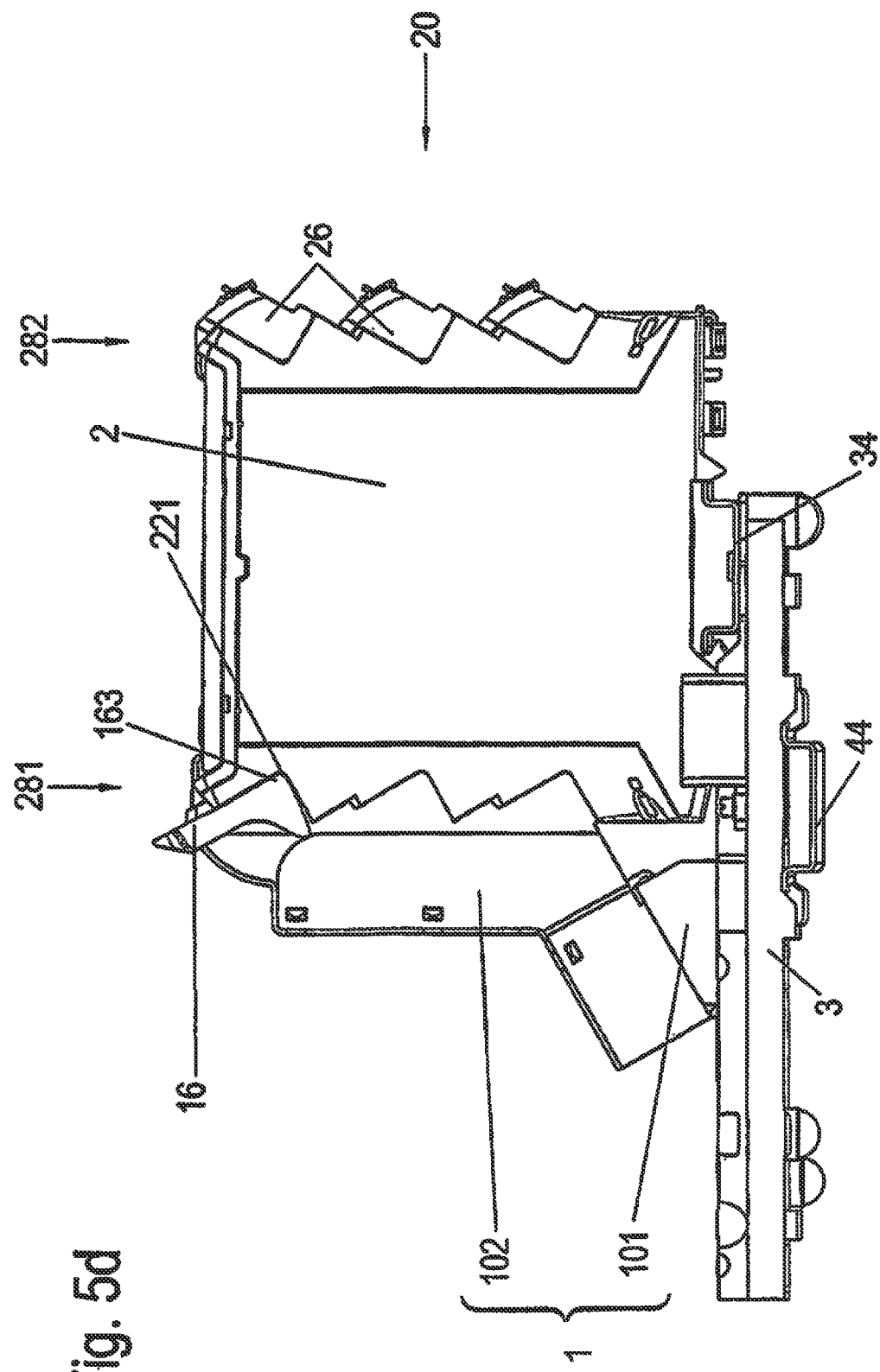

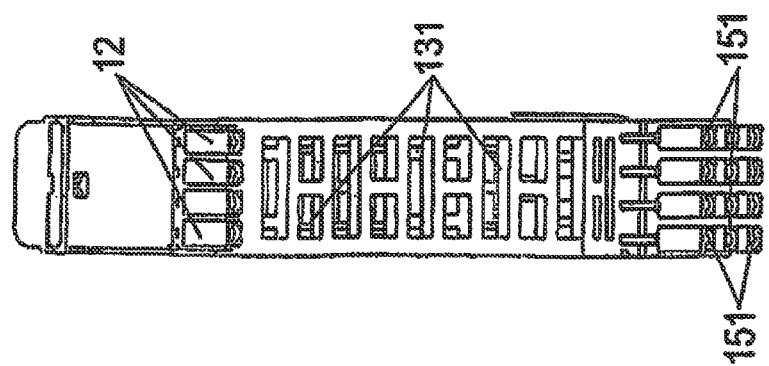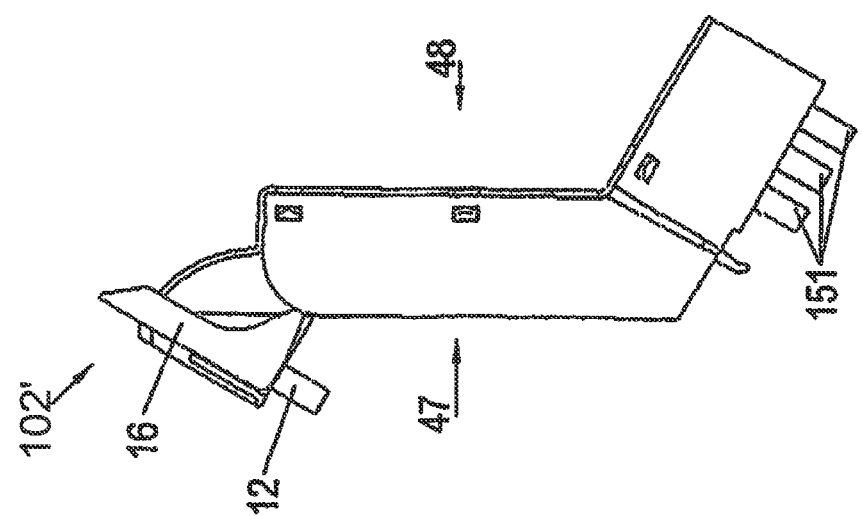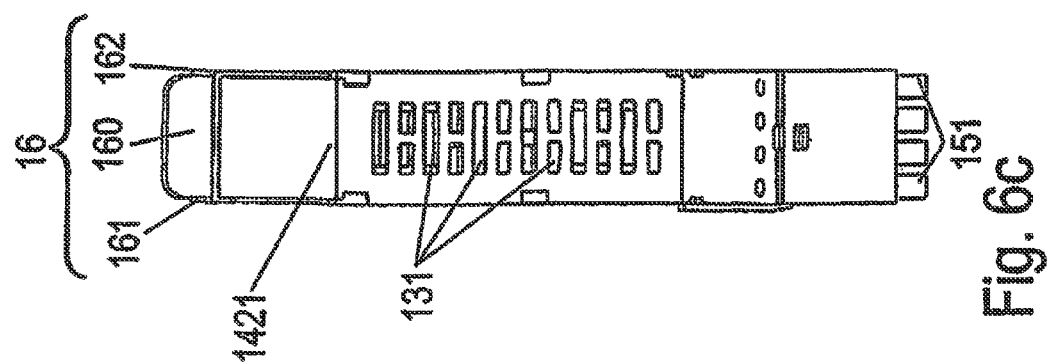

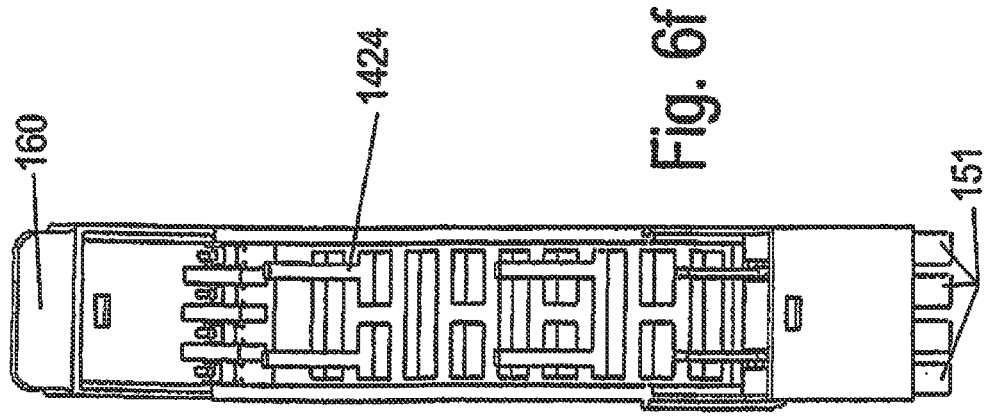
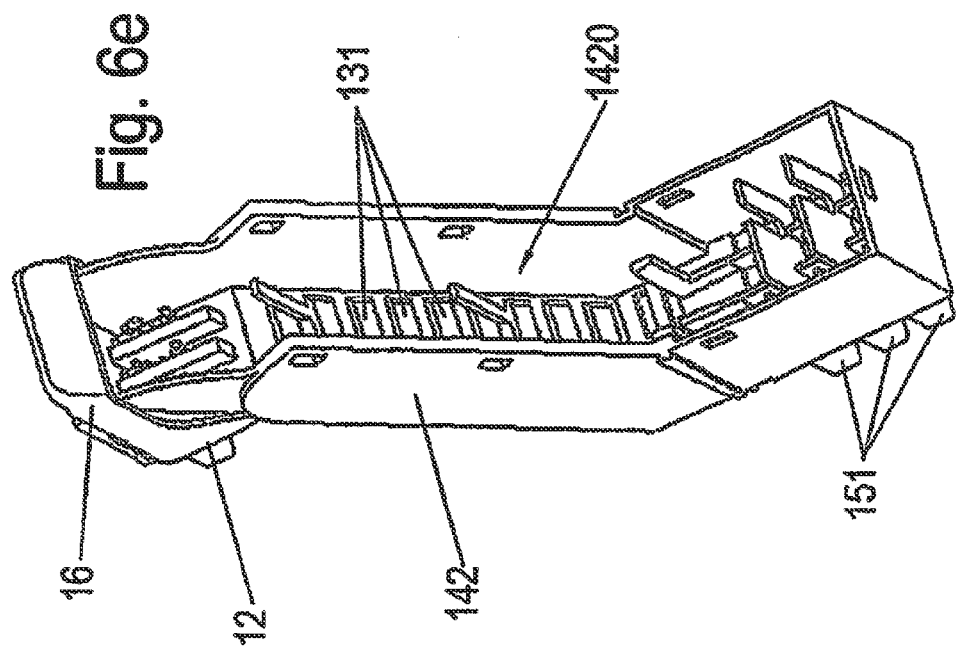

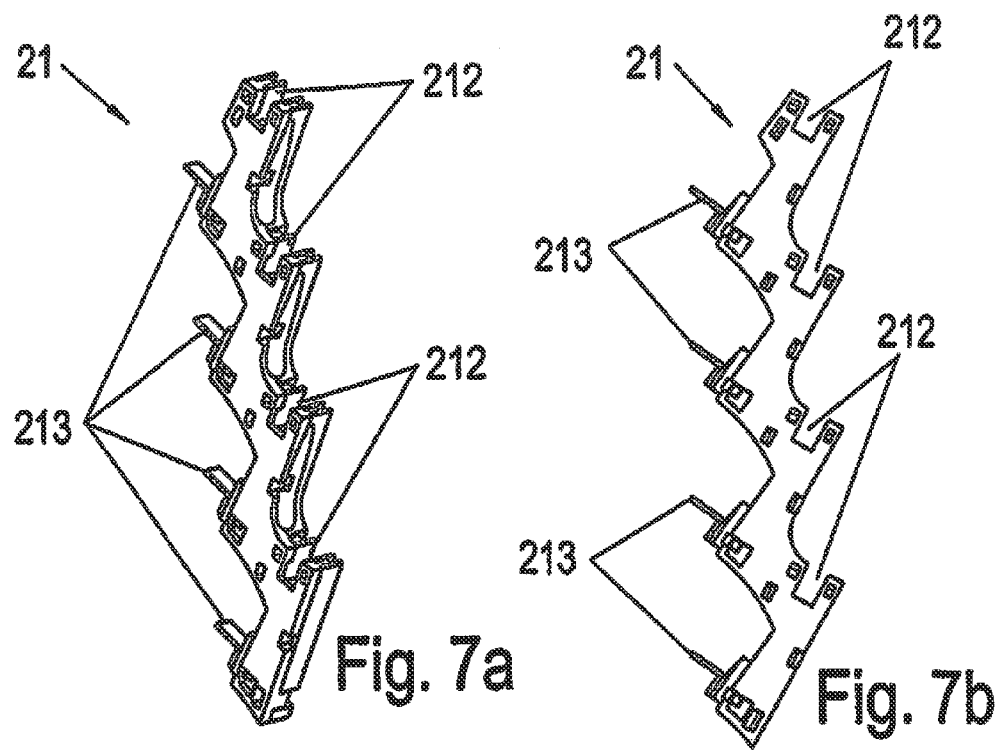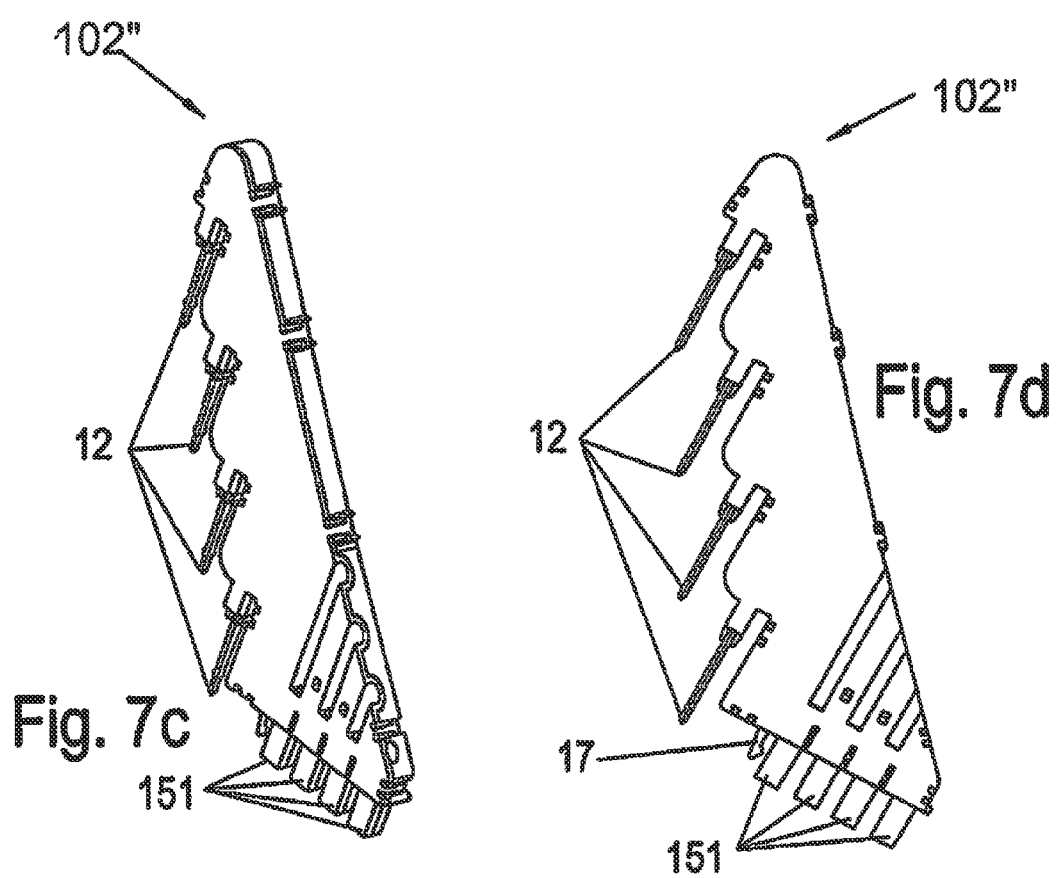

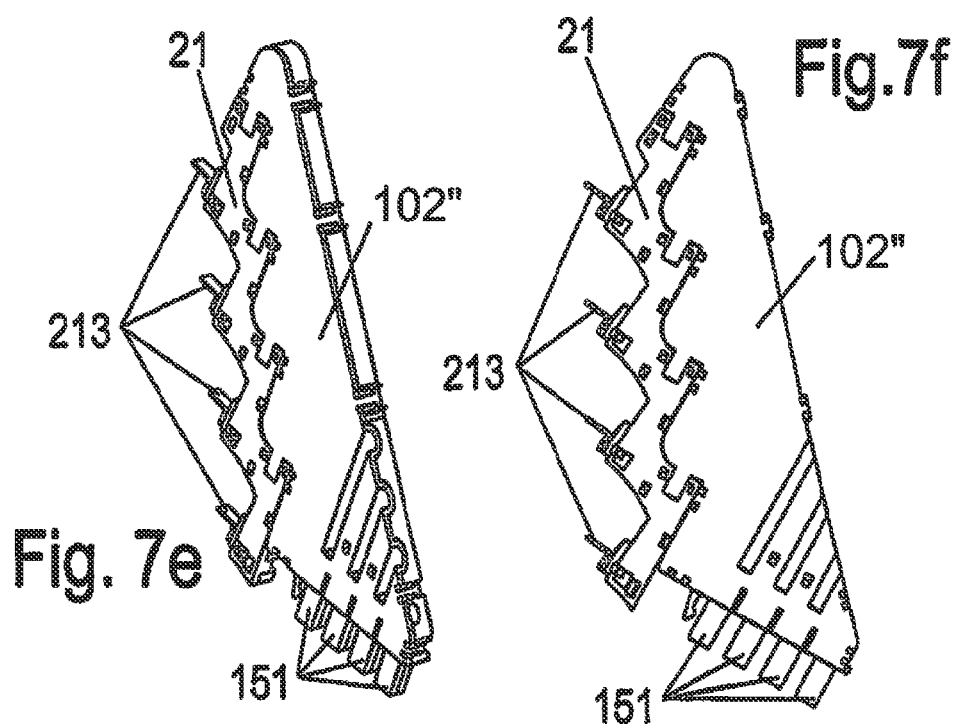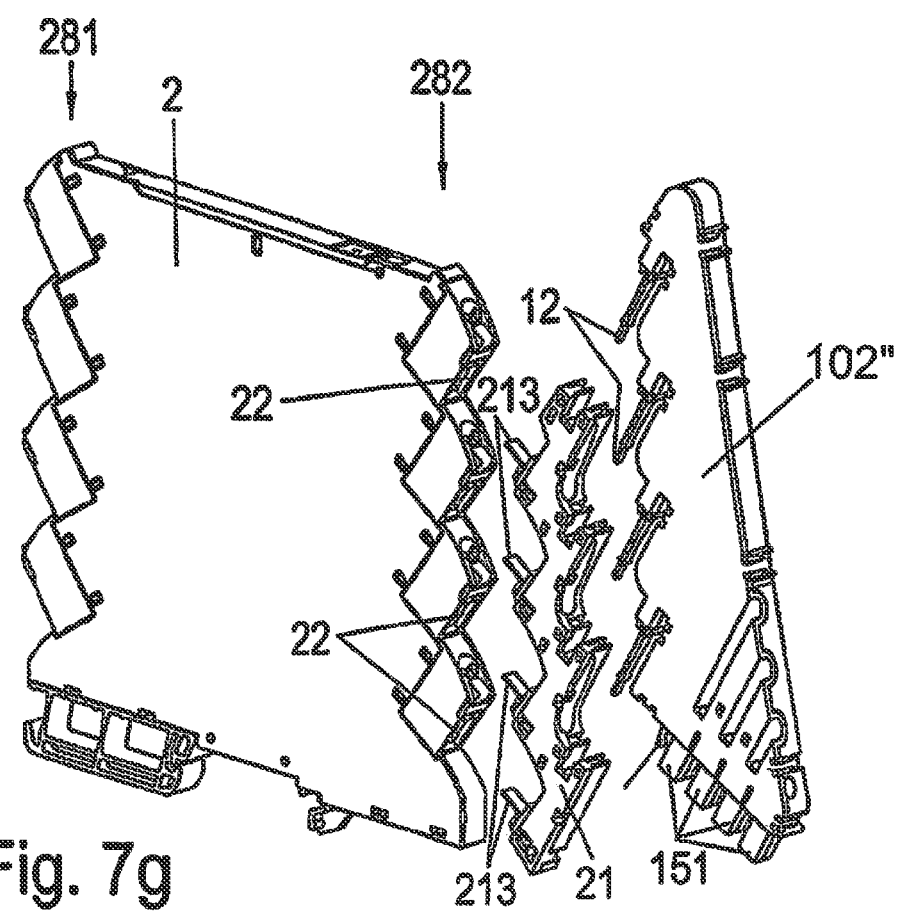

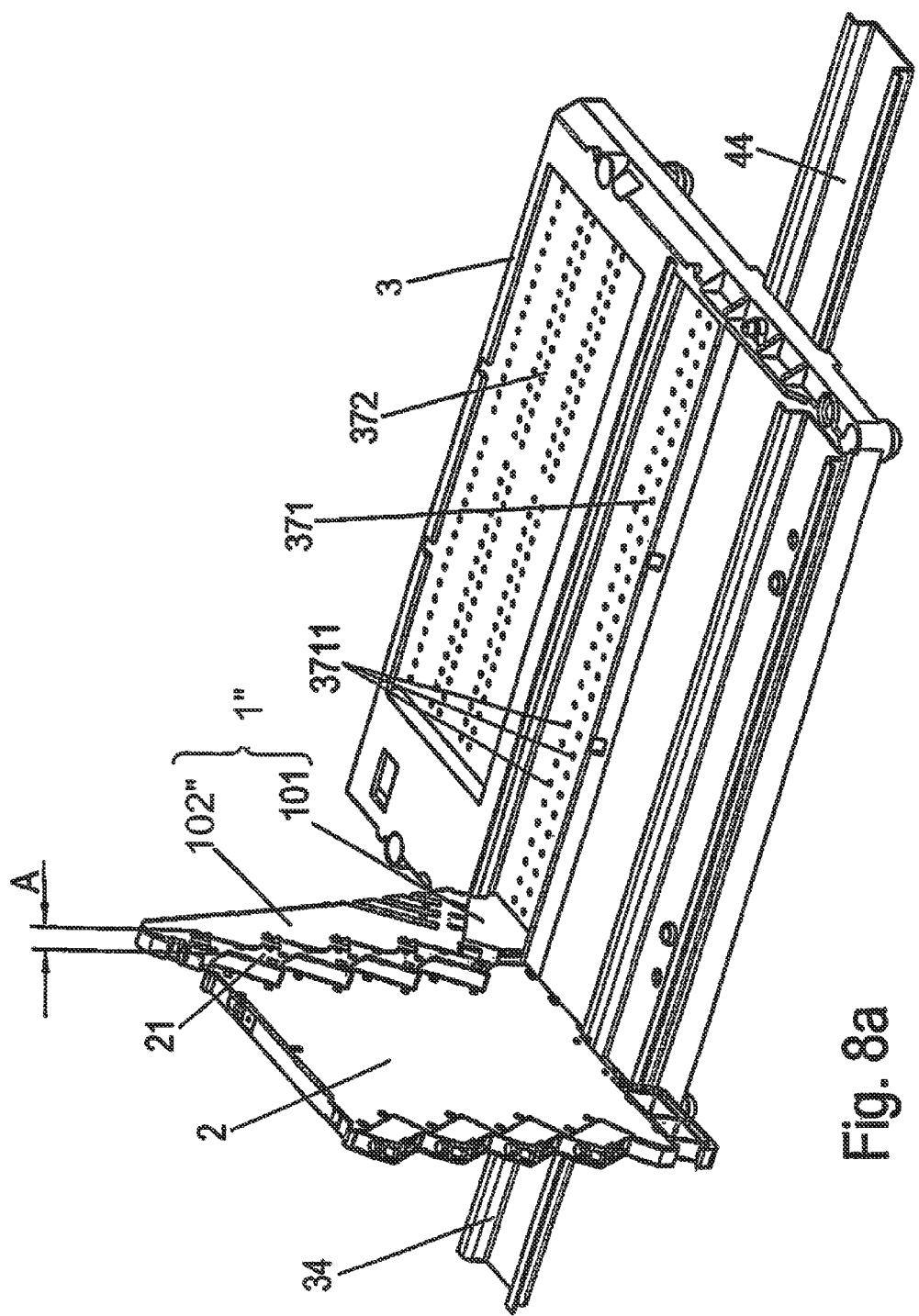

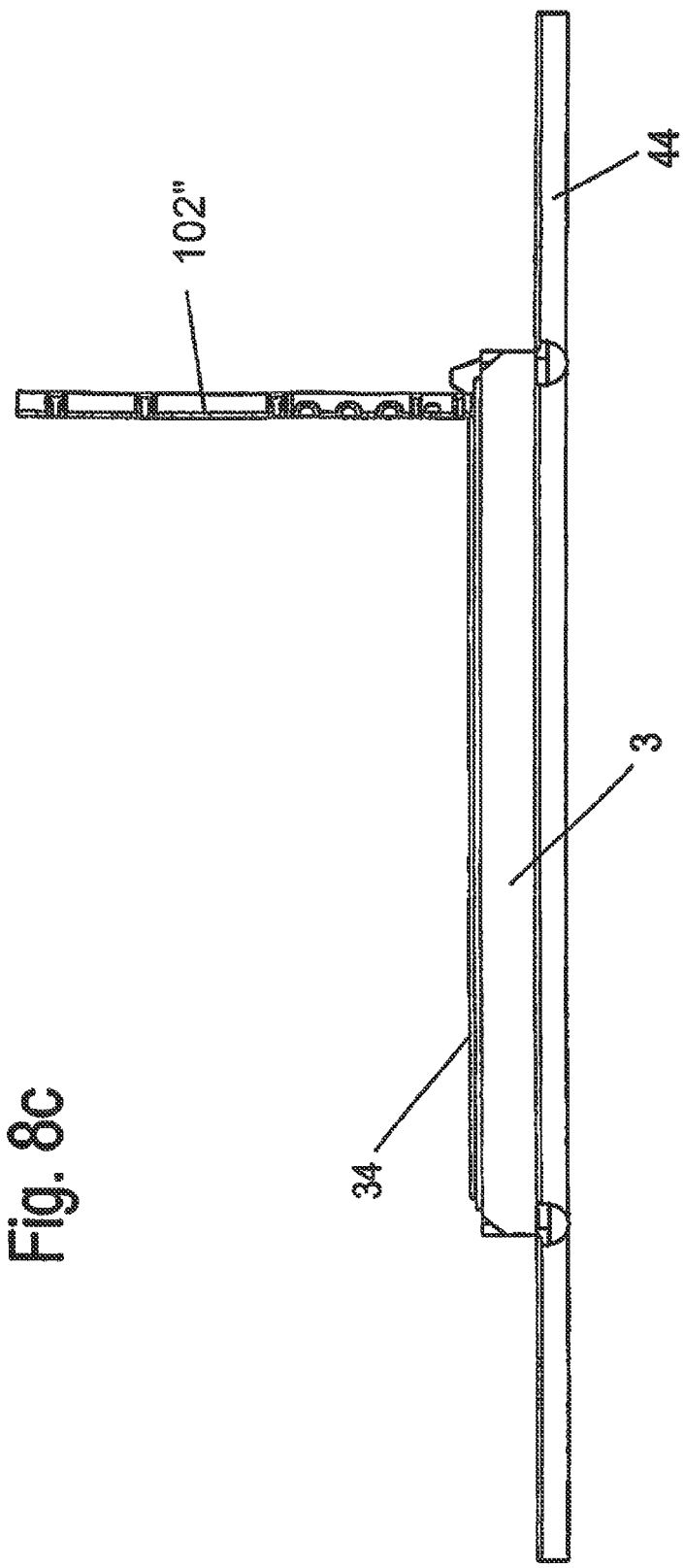

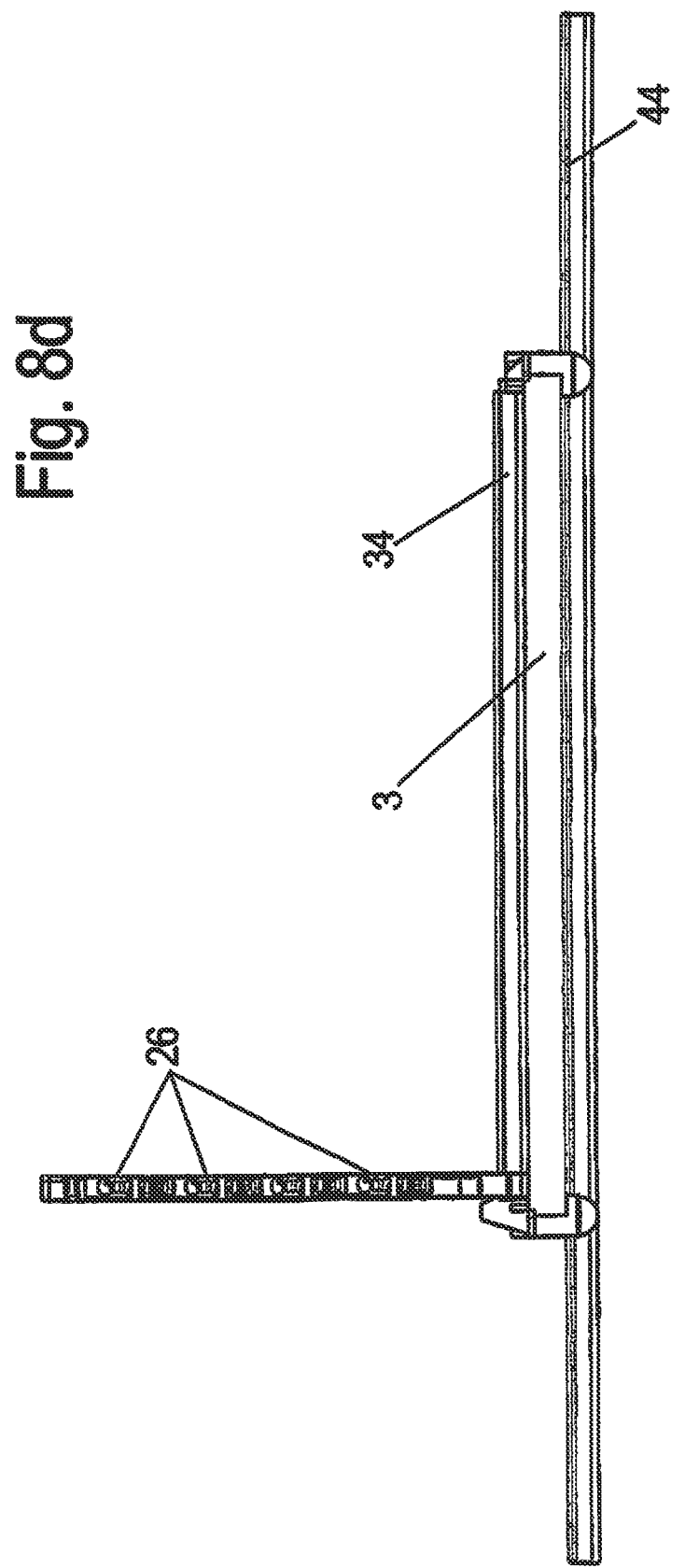

ATTACHMENT HAVING A MODULE AND AN ELECTRONICS ATACHMENT

REFERENCE TO RELATED APPLICATIONS

This application is a national stage application under 35 C.F.R. §371 of the PCT International Application No. PCT/EP2014/050432 filed Jan. 13, 2014, which claims priority of the German application No. DE 200 2013 100 208.9 filed Jan. 15, 2013.

BACKGROUND OF THE INVENTION

1. Field of the Invention

An adapter arrangement for electrically connecting an upwardly-directed first contact on a horizontal printed circuit board assembly with a generally upwardly-directed second contact on an electronics module mounted on the PCB assembly, including a rigid housing adapted for mounting on one end of the module, which housing contains a generally vertical conductor having a lower end connected by a downwardly directed lower terminal with the PCB assembly first contact, and an upper end connected by a generally downwardly-directed upper terminal with the electronics module second contact, characterized in that the lower adapter terminal is vertical, and the upper adapter terminal is downwardly inclined by an acute angle relative to the vertical.

2. Description of Related Art

Production technology frequently uses various production resources to perform production tasks. The production resources are mostly controlled by means of control signals provided by a control printed circuit board (PCB). For that purpose, control modules are assigned to the production resources, wherein the control signals are interchanged between the control PCB and the control modules via a bus, for example. On the one hand, strict security requirements exist for control signal transmission, posing major challenges for the electrical and mechanical development of the connection means. On the other hand, changes in the production task frequently require resetting of the control modules. For that reason, there is a need for modules to have availability of connection systems that can be converted quickly and easily.

The German printed specification No. EP 1 520 330 B1 discloses the use of a generally L-shaped carrier for connecting such control modules with a control PCB, onto which the modules can be connected with a swivel motion. The connection systems for the solution have a very complex design, and performing the swivel motion is difficult.

From other prior art it is also known to produce the connection by means of flexible leads, something that is rather costly and obscure. The present invention was developed to avoid the above and other drawbacks of the know connecting systems.

SUMMARY OF THE INVENTION

Accordingly, a primary object of the present invention is to provide an adapter arrangement for electrically connecting an upwardly-directed first contact on a horizontal printed circuit board assembly with an upwardly-directed second contact on an electronics module mounted on the PCB assembly, including a rigid housing adapted for mounting on one end of the module, which housing contains a generally vertical conductor having a lower end connected by a downwardly directed lower terminal with the PCB assembly first contact, and an upper end connected by an upper terminal with the electronics module second contact, characterized in that the lower adapter terminal is vertical, and the upper adapter terminal is downwardly inclined by an acute angle relative to the vertical.

According to another object of the invention, the adapter arrangement is sectional and includes upper and lower sections having cooperating intermediate terminals that are inclined at an acute angle to the vertical.

According to another object of the invention, an auxiliary adapter section is arranged between the upper adapter section and the electronics module, said auxiliary adapter section and said upper adapter section having cooperating intermediate terminals that are arranged at an acute angle relative to the vertical.

Another object of the invention is to create a space-saving and cost-effective arrangement with an electrical connection and/or control module and an electronics arrangement, in particular a printed circuit board arrangement, which meets the high security requirements, facilitates very fast and simple resetting of the connection and/or control module, and ensures durable operation of the connection and/or control module, particularly if subjected to high vibration loads and extreme temperatures.

According to the present invention, an adapter is provided, which serves for connecting an electrical connection module, particularly with an electrical printed circuit board and a printed circuit board arrangement. The adapter has at least one first connector and one second connector. The connectors are arranged in an adapter housing and are electrically connected to one another. This comprises both an embodiment in which the connectors are directly connected to one another as well as also an embodiment in which the adapter includes electrical components, for example a filter or similar that are arranged between the connectors.

In this context, the first connector extends in an extension direction. The adapter is characterized particularly in that the second connector is provided at a specified (that can preferably not be changed on the adapter) angle to the first connector.

It is furthermore preferred that the adapter has at least two second connectors, which are both arranged relative to one another and in addition are offset in terms of height.

The angle is preferably greater than 0°. In this context, for advantageous handling it is preferably 20°-70°, particularly preferably 30°-50°. It can however also have smaller or larger angular sizes. Moreover it is preferred that the extension direction is a vertical direction. As a result, the first and second connectors point downwards. This arrangement facilitates that the adapter can be slid from the top onto the printed circuit board and the connection board.

Preferably, the adapter has an adapter housing made of a rigid plastic so that it can be handled easily and safely. This particularly significantly simplifies the assembly that employs a solution using flexible cables according to the nature of DE 10 2010 046 990 B.

In the assembled state, the adapter preferably bears against/rests on the connection module. In order to ensure the ventilation of the connection module, in one embodiment which solves this problem it is preferred that at least one vent or multiple vent slots is or are provided in the adapter housing, in particular for ventilation of the connection module. This will prevent overheating of the connection module, if the adapter is fitted on the connection module.

In a preferred embodiment, the first and/or the second connector/s comprise/s two or more electrical contacts, at least partially. Preferably, the adapter has four first connectors with two electrical contacts in each case. The electrical contacts are preferably designed as connectors that are insulated on both sides. In this embodiment, an 8-core connection is enabled by means of the first four connectors. The connectors can be connected with bus bars or be designed as the ends of bus bars.

In a preferred embodiment, the adapter includes a first adapter part and a second adapter part, wherein the first or the first connector/s are arranged on the first adapter part and the second or the second connector/s are arranged on the second adapter part. The adapter parts are preferably provided detachably from one another. It is particularly preferred if they can be plugged or slid into or on top of each other. It is particularly preferable, if the second adapter part can be plugged-in on top of the second adapter part. In this embodiment, the adapter parts can be handled independently of one another, or jointly.

In order to establish electrical connections between the first connector/s and the second connector/s, it is therefore preferred that one or multiple first electrical plug adapter/s are provided on the second adapter part, which can be connected to one or multiple first electrical mating adapters of the first adapter part. The first plug adapters are preferably arranged parallel to the second plug adapter/s. They therefore have the angle relative to the extension direction. In this embodiment, the adapter can be connected particularly easily, in that the first adapter part is handled independently from the second adapter part.

The first plug adapter and the second mating adapter are preferably designed as push-in connectors with a corresponding socket connection. For this purpose, both the first plug adapter can be designed as connector and the first mating adapter as socket connector, or vice versa. Instead of a push-in connector, which offers high contact stability and can be fitted very easily, moreover also another wiring technique is possible, for example a development of the first plug adapters and the first mating adapters as contact areas.

To even still further simplify the handling of the adapter, a handling device, preferably a lever, is provided, which makes it possible to lift the second adapter part out of a connection module, into which it is plugged-in.

This problem is furthermore solved with an arrangement with such an adapter, and an electrical connection module and a printed circuit board arrangement, in particular an electrical printed circuit board of the printed circuit board arrangement. The electrical printed circuit board preferably includes a bus bar. For this reason, the adapter is provided for the electrical connection of the electrical connection module with the bus bar. For this purpose it is preferred that the bus bar is designed as printed circuit board interface, which also includes an electrical circuit. In this embodiment, the bus bar is for example also connected by means of a cable with a control PCB, which can be arranged both inside the printed circuit board arrangement as well as also outside of the printed circuit board arrangement. The bus bar is preferably also provided as a multicore cable.

The printed circuit board arrangement preferably comprises multiple adjacently arranged slots, each of which are provided for the insertion of an electrical connection module.

Preferably, each of the slots are separated from their adjacent slots by a partition. Furthermore, a back panel is preferably provided in each slot. The partitions and the back panels facilitate that a connection module can be positioned in its slot.

For the electrical connection of the adapter particularly to the printed circuit board of the printed circuit board arrangement, preferably in each slot a first mating connector is provided, which is developed corresponding to the first connector of the adapter. Likewise, each connection module preferably comprises at least a second mating connector, which is designed corresponding to the second connector/s, in order to connect the adapter to the connection module. The connector and the mating connector are preferably developed as push-in connectors with a matching socket connector. For this purpose, both the first plug adapter can be developed as connector and the first mating adapter as socket connector, or vice versa. Instead of a push-in connector, which offers high contact stability and can be fitted very easily, moreover also another wiring technique is possible, for example developing the first plug adapters and the first mating adapters as contact areas.

In an alternative embodiment of the printed circuit board arrangement is likewise preferable that a first connector panel, in particular a plug-in section comprises a through-hole printed circuit board, for example, onto which the first connector/s can be connected. This embodiment has the advantage that the electrical connections of the printed circuit board arrangement, in particular the bus bar, are arranged in an interior space of the housing of the printed circuit board arrangement, and are therefore electrically insulated and/or are dust-protected and/or moisture repellent.

In order to secure the connection modules, it is preferred that the electronics arrangement, particularly printed circuit board arrangement, comprises a first mounting rail, onto which the connection modules can be mounted detachably side-by-side. For this purpose it is preferred that each connection module comprises an actuating means for detaching the connection module from the first mounting rail.

In a preferred embodiment, a connection bus is provided on the first mounting rail. The connection bus is preferably provided for the voltage supply of the connection modules. In addition, said connection bus likewise comprises preferably further signal leads for the connection modules.

In the assembled state, it is preferred that each time a connection module is arranged in a slot and is attached on the first mounting rail. In addition, the adapter is slipped onto the connection module and the printed circuit board arrangement. For this purpose, it preferably bears against the connection module. Likewise, the adapter is preferably arranged transverse to the printed circuit board and parallel to the electrical connection module. In this arrangement, the angle between the first and second connectors makes it difficult for the adapter to be intermittently disconnected by shaking. As a result, also the connectors cannot be dislodged from the mating adapters, so that the electrical contact is safely assured even when subjected to strong vibrations.

In the alternative embodiment, in which the printed circuit board arrangement includes the first connector panel, the connection module is preferably likewise secured on the first mounting rail. In addition, the adapter is preferably slipped onto the connection module and the first connector panel of the printed circuit board arrangement. For this purpose, it preferably bears against the connection module. This embodiment can be handled particularly easily, in that initially the first adapter part, preferably by fitting-on or by slipping-on in the extension direction onto the first connector panel, and subsequently the second adapter part, preferably by fitting-on or by slipping-on in a plug-in direction, which runs at an angle to the extension direction, is fitted onto the connection module and the first adapter part.

The vent in the adapter moreover prevents overheating of the connection module, even if the outside temperatures are high.

A method is also created for assembling an electrical connection module on an electronics arrangement, in particular printed circuit board arrangement, with the steps of:

Locking the connection module onto the first mounting rail of the electronics arrangement, in particular printed circuit board arrangement, Arranging the adapter on the electronics arrangement, in particular printed circuit board arrangement, so that the first connector is interlocked with the first mating connector of the electronics arrangement, in particular printed circuit board arrangement, and the second connector is interlocked with the second mating connector of the electrical connection module, until the adapter bears against the electrical connection module.

The electrical connection will therefore be securely provided permanently by simple slip-on. For resetting, the adapter must merely be extracted opposite to the plug-in direction. This is also possible very quickly with the two-piece embodiment of the adapter by the simplified handling assisted by the lever. The connection module can subsequently be detached from the first mounting rail by means of the actuating means. Consequently, resetting can be done very quickly and easily.

BRIEF DESCRIPTION OF THE DRAWINGS

Other objects and advantages of the invention will become apparent from a study of the following specification, when viewed in the light of the accompanying drawing, in which:

FIGS. 1a-1c are left side, rear and right side elevation views of a connector housing;

FIG. 3 is a perspective view of the apparatus of FIG. 2b mounted on a printed circuit board assembly;

FIGS. 4b-4d are left side, front, and rear elevation views of the apparatus of FIG. 4a.

FIG. 5a is a perspective view of the embodiment of FIG. 4a mounted on a printed circuit board assembly; FIGS. 5b and 5c are right and left hand elevation views of the apparatus of FIG. 5a, respectively; and FIG. 5d is a left hand end view of the apparatus of FIG. 5a;

FIG. 6a is a perspective view of a modification of the apparatus of FIG. 4a; FIGS. 6b, 6c and 6d are left side elevation, front elevation and rear elevation views, respectively, of the apparatus of FIG. 6a; and FIGS. 6e and 6f are front perspective and front elevation views of the apparatus of FIG. 6a with the cover element removed;

FIGS. 7a and 7b are perspective and side elevation views, respectively, of and intermediate member used with another embodiment of the invention; FIGS. 7c and 7d are perspective and left side elevation views, respectively, of the upper section of a connector used with this embodiment; FIGS. 7e and 7f are perspective and side elevation views of the assembly of the components of FIGS. 7a and 7c.

FIG. 8a is a perspective view of the apparatus of FIG. 7h mounted on a printed circuit board assembly; FIG. 8b is a left hand end view of the apparatus of FIG. 8a; FIGS. 8c and 8d are left hand and right hand side elevation views, respectively, of the apparatus of FIG. 8b; and FIG. 9 is a perspective view of the lower adapter section of FIG. 5a.

DETAILED DESCRIPTION OF THE INVENTION

FIGS. 1a-3

Figure 2A:
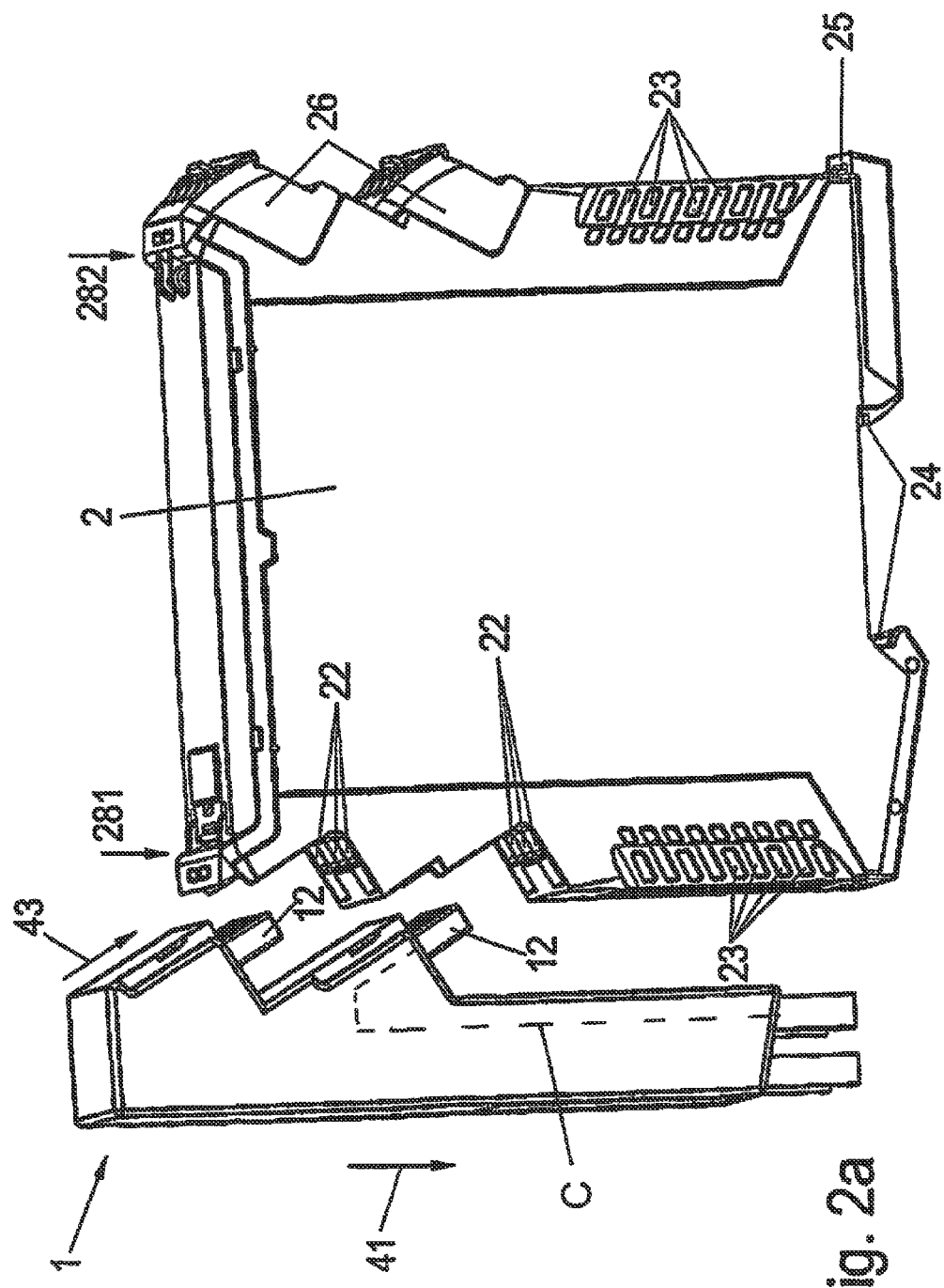
FIGS. 2a and 2b are left and right perspective view of an electronics module and connector housing when in the exploded and connected conditions, respectively.

Referring first more particularly to FIG. 3, in accordance with the present invention, the adapter connector 1 is designed to electrically connect the terminals at one end 281 of an electronics module 2 with corresponding contacts 31 of a printed circuit board arrangement 3. At its other end 282, the module 2 is provided with connectors 26 having contacts 27 that are connected with various control systems (not shown). The bottom 29 of the module is connected with a module mounting rail 34 by releasable locking means 25. A plurality of modules are mounted in slots 33 defined on the PCB assembly 3 by partitions 32 having back walls 321. A main mounting rail 44 serves to mount the PCB assembly upon a fixed support (not shown). A bus bar 35 mounted in the module mounting rail 34 has tracks 351 for supplying electrical power and control signals to the contacts 31 of the PCB assembly 3, and then to the modules 2 via the adapter 1.

FIG. 1 shows an adapter 1 for connecting an electrical connection module 2 with an electronics arrangement, in particular a printed circuit board arrangement 3 with a printed circuit board or a pressed screen, for example. An electrical connection module 2 is a control module, for example, that is provided in the production technology for controlling a production means (not shown) assigned to it. An electrical electronics arrangement, in particular printed circuit board arrangement 3, preferably comprises a bus bar (not shown) that is provided with a control PCB (not shown) for controlling a multiple of such connection modules 2 or production resources. Or also preferably, it includes such a control PCB.

The adapter 1 is provided for the secure electrical connection of the bus bar or the controlled PCB of the printed circuit board arrangement with the electrical connection module 2. It preferably carries signal leads 11, 12, but can also be developed for supply leads.

For connecting the adapter 1 to the printed circuit board 3 or to the bus bar of the electronics arrangement, in particular the printed circuit board arrangement 3, it comprises first connectors 11, which are designed as push-in connectors here. The first connectors 11 are arranged in two rows. In this adapter 1, a total of four first connectors 11 are provided, each of which have two double-sided insulated electrical contacts 111 (FIG. 1b). As a result, in this case an 8-core connection by means of the first four connectors 11 can be realized.

Second connectors 12 are provided for connecting the adapter 1 to the connection module 2. The second connectors 12 are arranged in two rows that are reciprocally offset by a height offset Δh (FIG. 1a). The second connectors 12 moreover comprise an angle α relative to the first connectors 11.

The adapter 1 in an assembled state M extends into a vertical extension direction 41, so that the first and second connectors 11, 12 are arranged pointing downwardly.

The first and second connectors 11, 12 are arranged in an adapter housing 14, which is preferably rigid and is formed from an insulating material (in particular a synthetic plastic material). To facilitate ventilation of the connection adapter 2 in the assembly state M, a vent arrangement 13 is provided in the adapter housing 14.

FIG. 2a shows arranging the adapter 1 on an adapter side 281 of an electrical connection module 2. On an adapter side 281 of the opposite connections side 282, two plug connections 26 are provided, which provide standard connectors 27 (see FIG. 3) to a user.

The electrical connection module 2 comprises second mating connectors 22 on the adapter side 281, which are arranged at the same angle α relative to the first connectors 11. The second mating connectors 22 are also arranged in two rows, which have the reciprocal height offset Δh. Since in this embodiment the adapter 1 extends in the vertical direction in the assembly state M, the angle α is an angle α relative to the vertical.

In this embodiment, the second mating connectors 22 are developed as socket connectors. However, an embodiment is also conceivable in which the second connectors 12 are developed as socket connectors and the second mating connectors 22 are developed as connectors.

It can be seen in FIG. 2a that the adapter 1 comprises eight single-pin second connectors 12. However, an embodiment is also conceivable, in which the second connectors 12, as in the first connectors 11 of the adapter 1, comprise two electrical contacts (not shown) that are insulated from one another.

Figure 2B:
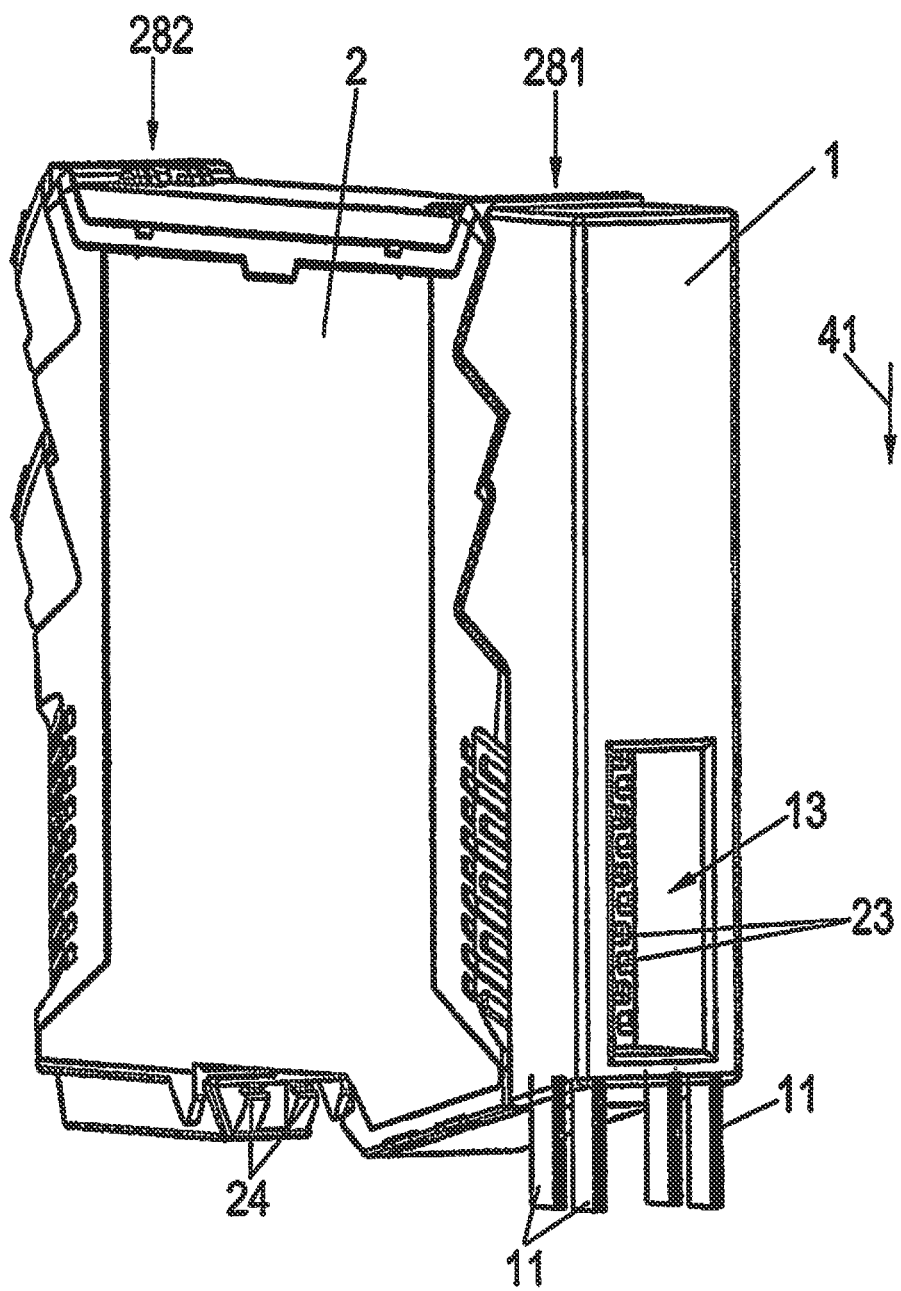
Figure 4A:
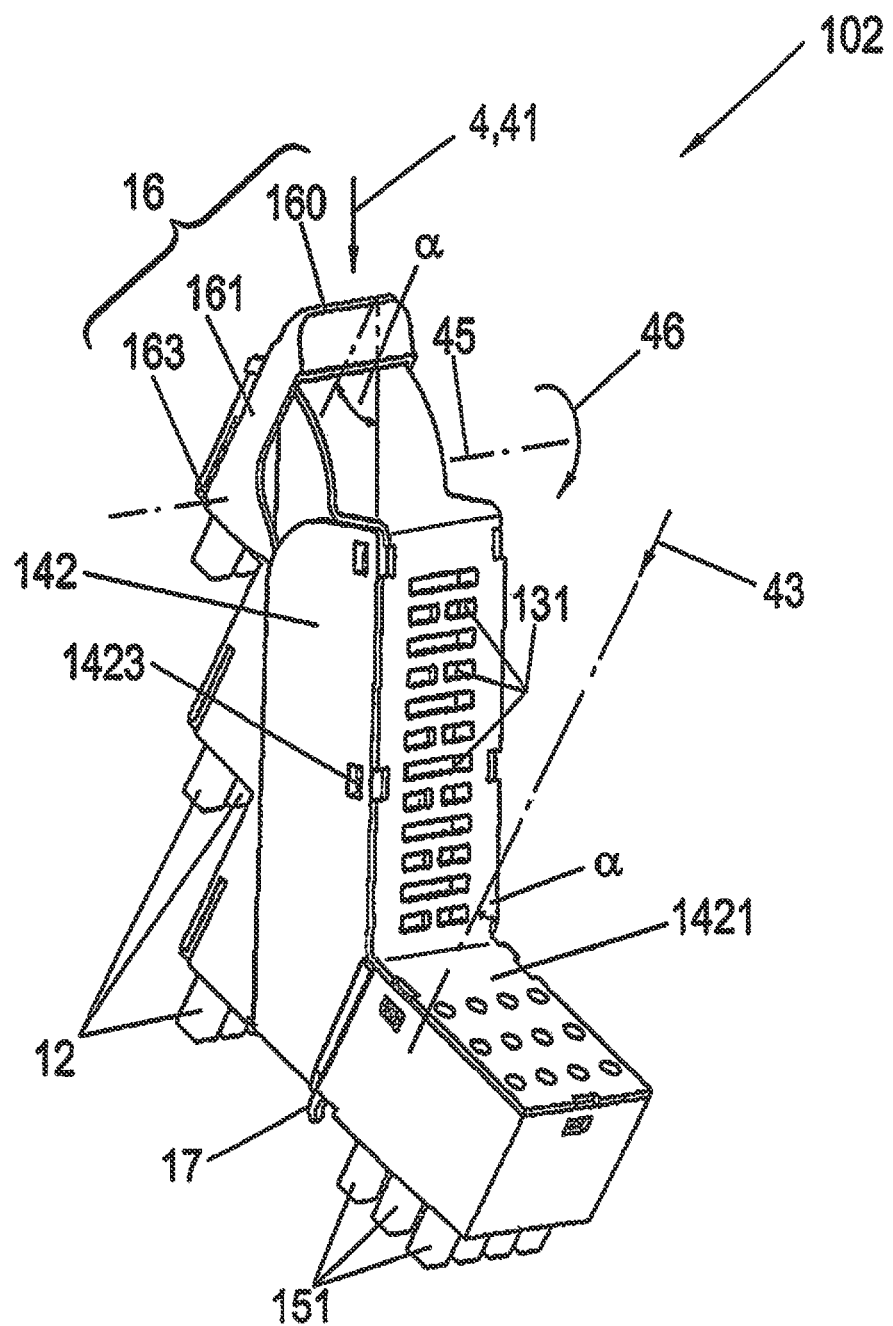
FIG. 4a is a left side perspective view of a connector housing section of second embodiment of the invention.
Figure 4E:
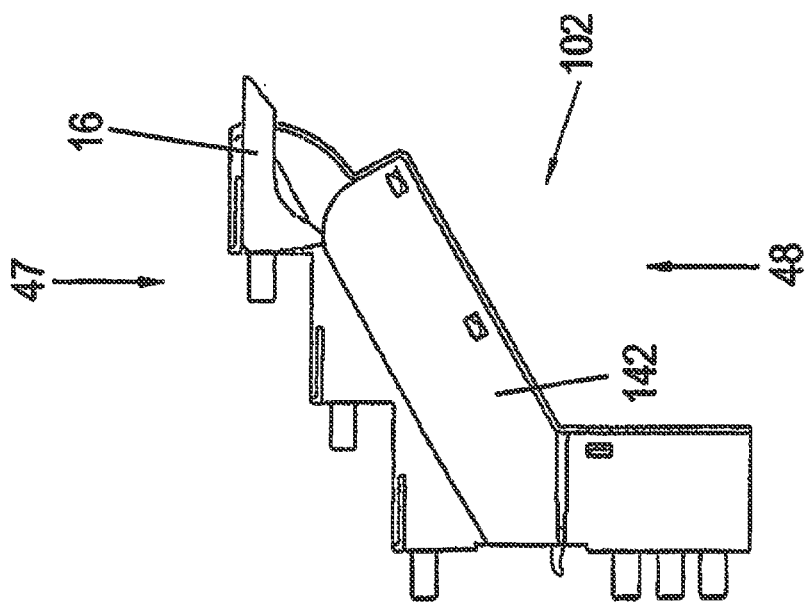
FIGS. 4e and 4f are left side, and front views of the housing section of FIG. 4a when rotated through a small angle in the clockwise direction.
Figure 4F:
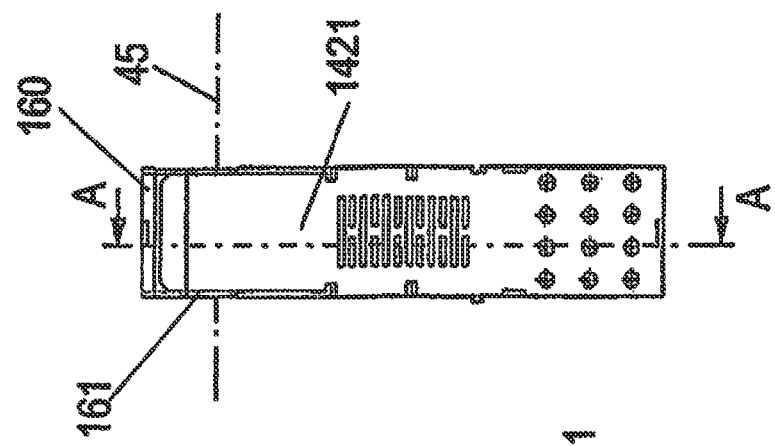
Figure 4G:
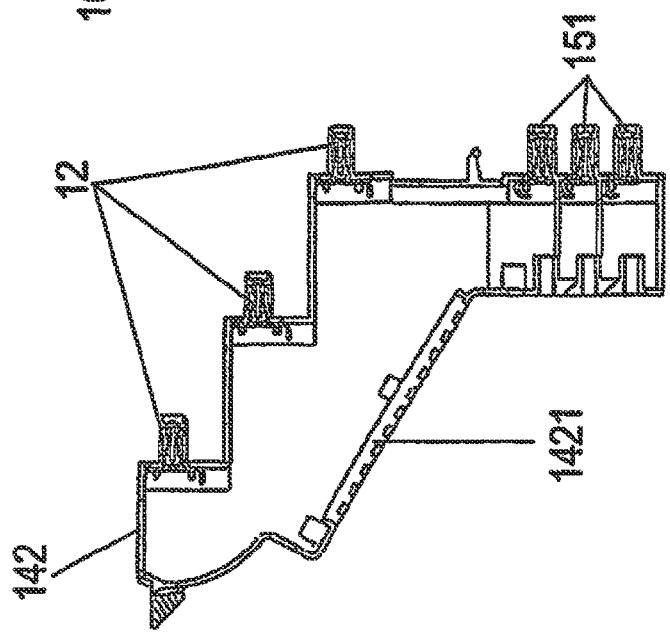
FIG. 4g is a sectional view taken along line A-A of FIG. 4f.

By moving the adapter 1 in a plug-in direction 43 which comprises the angle α relative to the vertical, the second connectors 12 can be plugged into the second mating connectors 22. The adapter 1 that is arranged on the connection module 2 is shown in FIG. 2. For this reason, FIG. 2b shows the assembly state M, but without the printed circuit board assembly 3.

For securing the connection module 2 onto an electronics arrangement comprising a printed circuit board, particularly printed circuit board arrangement 3 (see FIG. 3), latching means 24 are provided, with which the connection module can be locked non-detachably onto a first mounting rail 34 (see FIG. 3) of the electronics arrangement, particularly printed circuit board arrangement 3. In addition, an actuating means 25 for detaching the latching is provided, so that the connection module 2 can be detached again from the printed circuit board 3. The actuating means 25 is arranged on the connection side 282 of the connection module 2. Consequently it is easily accessible for an operator.

In order to provide adequate ventilation to the electronics of the connection module 2, cooling vents 23 are provided through which the cool air can flow in and warm air can flow out of the connection module 2. The adapter 1 bears against the connection module 2 in the assembled state M. In order to ensure continued cooling in this state M, the vent 13 is provided in the adapter 1 to facilitate the air exchange even if the adapter 1 is connected.

FIG. 3 shows an arrangement with the connection module 2, the electronics arrangement, in particular the printed circuit board arrangement 3 and the adapter 1. FIG. 3 also shows the assembly state M.

The adapter 1 and the connection module 2 here extend in the vertical direction, the printed circuit board 3 parallel to the horizontal. On the electronics arrangement, in particular on the printed circuit board arrangement 3 (or on a pressed screen arrangement or such), a module mounting rail 34 is arranged, which extends into a mounting rail direction 42. The module mounting rail 34 is provided for securing multiple connection modules 2. In order to make it easier to position the connection modules 2 adjacently, the electronics arrangement, in particular the printed circuit board assembly 3, comprises slots 33. The slots 33 are arranged orthogonally to the mounting rail direction 42 and are separated from one another by partitions 32. In addition the slots include a back panel 321.

The module mounting rail 34 has a generally hat-shaped cross-sectional configuration, and comprises two spaced-apart locking legs 341. In order to secure the connection modules 2 on the printed circuit board 3, the latching means 24 (see FIG. 2b) of the connection modules 2 engage behind the locking legs 341.

In the embodiment of the arrangement shown here, the interspace between the locking legs 341 is used for a connection bus bar 35 that feeds a supply voltage and additional control signals to the connection modules 2. For that purpose, the connection bus bar 35 has multiple conductor tracks 351, which pick off the connection modules 2 on their bottom surface 29.

In the slots 33, first mating connectors 31 of the PCB assembly are provided, onto which the first connectors 11 of the adapter 1 can be connected. Here, the first mating connectors 31 are developed as socket connectors. For this reason, the slots can be seen from the inside.

In principle, an embodiment of the adapter 1 and the electronics arrangement, in particular the printed circuit board arrangement 3 is also conceivable, in which the first connectors 11 are developed as socket connectors and the first mating PBB connectors 31 are developed as connectors.

The electronics arrangement, in particular printed circuit board assembly 3 comprises a housing, preferably a card cage 36, in which the bus bar and/or the control PCB/printed circuit board are arranged. Since the first connectors 11 allow an 8-core connection here, the bus bar is preferably designed to be at least 8-core.

It can also be seen that the electronics arrangement, in particular printed circuit board arrangement 3, is arranged on a second, external mounting rail 44. In order to connect the connection module 2 to the electronics arrangement, in particular printed circuit board arrangement 3, the connection module 2 is positioned in the slot 33 in this arrangement. After that it will be locked onto the first mounting rail 34, which is preferably produced separately to the card cage and is then locked to it.

The adapter 1 is subsequently slipped onto the arrangement. For this purpose, it is shifted downwards in the plug-in direction 43, here at an angle α relative to the vertical. In this context, the first and second connectors 11, 12 are inserted into the first mating connectors 31 of the electronics arrangement, in particular printed circuit board arrangement 3, and into the second mating connectors 22 of the connection module 2. For this purpose the adapter 1 is shifted in the plug-in direction until it bears against the connection module 2.

The adapter 1 is removed from the arrangement by moving it against the plug-in direction 43 during resetting. The connection module 2 can subsequently be lifted off the mounting rail 34, by activating the actuating means 25. The adapter 1 permits a multicore bus connection for signal leads and optionally also supply leads to be made between the electronics arrangement, in particular printed circuit board arrangement 3, and the connection module 2. The adapter housing 14 protects the bus connection against dust, moisture and direct mechanical effects. Because of the angle α, at which the adapter 1 is slipped onto the connection module 2, the electrical connection is assured even during high vibration loads. In order to increase the reliability against being dislodged even more, it is conceivable to attach the adapter 1 additionally on the connection module 2, for example by locking.

At least one resilient conductor element C, in particular a spring element, can be provided between the at least one first connector 11 and the at least one second connector 12. FIGS. 4*a*-5*d* and 9

Referring now to FIG. 5*a*, according to a second embodiment of the invention, the adapter connector 1' is sectional and includes a lower section 101 (best shown in FIG. 9) and an upper section 102. As before, the electronics module 2 is mounded on the module rail 34 that is supported on the PCB assembly 3, which PCB assembly is supported on a fixed surface by the main mounting rail 44. Bus bar means (not shown) are provided in the space defined in the hat-shaped module mounting rail 34, and terminals extend downwardly into contacts 3711 carried by the front connection panel 371. A second or rear connection pane 1372 is also carried by the printed circuit board assembly 3.

As shown in FIGS. 4*a*-4*g*, the upper adapter section 102 carries a plurality of upper terminals 12 which are provided for connecting the adapter 1' to the connection module 2. The upper terminals 12 are arranged in three rows here, which are reciprocally offset in terms of height. They moreover comprise the angle α relative to the extension direction 41, which is the vertical direction 4 here, into which direction the lower terminals 11 extend.

Furthermore, on the upper adapter section 102 intermediate plug terminals 151 are provided, with which the upper adapter part 102 can be electrically connected with the intermediate adapter terminals 152 (see FIG. 9) on the lower adapter section 101. The intermediate plug terminals 151 also extend at an angle α relative to the vertical direction 4.

Mounting of the upper adapter section 102 is particularly easily accomplished by initially moving the upper adapter section 102 in the plug-indirection 43 at an acute angle α relative to the vertical direction 4.

The upper adapter section 102, includes a second adapter housing 142, which is preferably rigid and consists of an insulating material (in particular a synthetic plastic material). To facilitate ventilation of the connection module 2 in the assembly state M, vents 131 are provided in the adapter housing 142.

The upper adapter housing section 142 is developed as a frame part here, into which the adapter interior member 1421 can be latched. For this purpose, latching means 1423 are provided with which the adapter interior member 1421 can be latched in the upper adapter housing 142.

Disassembly of the upper adapter section 102 is furthermore simplified, in that a pivotal release lever 16 is provided on the upper adapter section 102. This release lever 16 is pivoted about a pivot axis 45 in a pivot direction 46. The lever 16 comprises a first limb 161 and a second limb 162, which are connected to one another by a cross limb 160. The cross limb 160 forms a grip component. The lever 16 is arranged on the upper adapter section 102 such that it encompasses the same. In each case, a contour 163 is provided on both limbs 161, 162 that interacts with a counter contour 221 (see FIG. 5*d*) on the connection module 2. On the adapter 1 arranged on the connection module 2, the contour 163 unwinds on the counter contour 221 in the pivot direction 46 when the lever 16 is pivoted, such that the second adapter part 102 is shifted opposite to the plug-in direction 43, as a result of which it is lifted out of the connection module 2.

An attachment means 17 can be seen in FIG. 4*b*, with which the second adapter part 102 can be mounted onto the lower adapter part 101. This is developed as a snap hook here. The terms handling device 17 and snap hook are used synonymously in the following. FIG. 4*c* shows a plug-in side 47 of the second adapter part 102, FIG. 4*d* shows a rear view 48 of the uppers adapter part 102. In the cross-sectional view of FIG. 4*g* it can be seen that the second terminals 12 and the first plug adapters 151 are developed as spring-loaded fingers.

FIG. 5 (*a*) shows the arrangement of the adapter 1' on the adapter side 281 of an electrical connection module 2 and on a further embodiment of the electronics module 3. Plug connections 26 are provided on the connection side 282 opposite the adapter side 281 also with this connection module 2. The mating connectors 22 of the connection module 2 are not visible here. However, they extend in the same manner as in the embodiments of FIG. 2*a* at an angle α relative to the extension direction 41.

The electronics assembly 3 is also developed as a printed circuit board arrangement in this embodiment. This embodiment differentiates from the one in FIG. 3 however in that the first connectors 11, which are arranged on the first adapter part 101, are inserted into plug-in connections 3711 of a first connector panel 371. This electronics module 3 moreover has a second connector panel 372 for other/ additional assemblies and modules (not shown).

In the side view of FIG. 5*b*, the rear of the adapter 1' is visible; the lateral view of FIG. 5*c* shows the front end 20 of the connection module 2. In the lateral view of FIG. 5*d*, the contour 163 of the adapter 1' and the counter contour 221 of the connection module 2 are represented.

Figure 9:
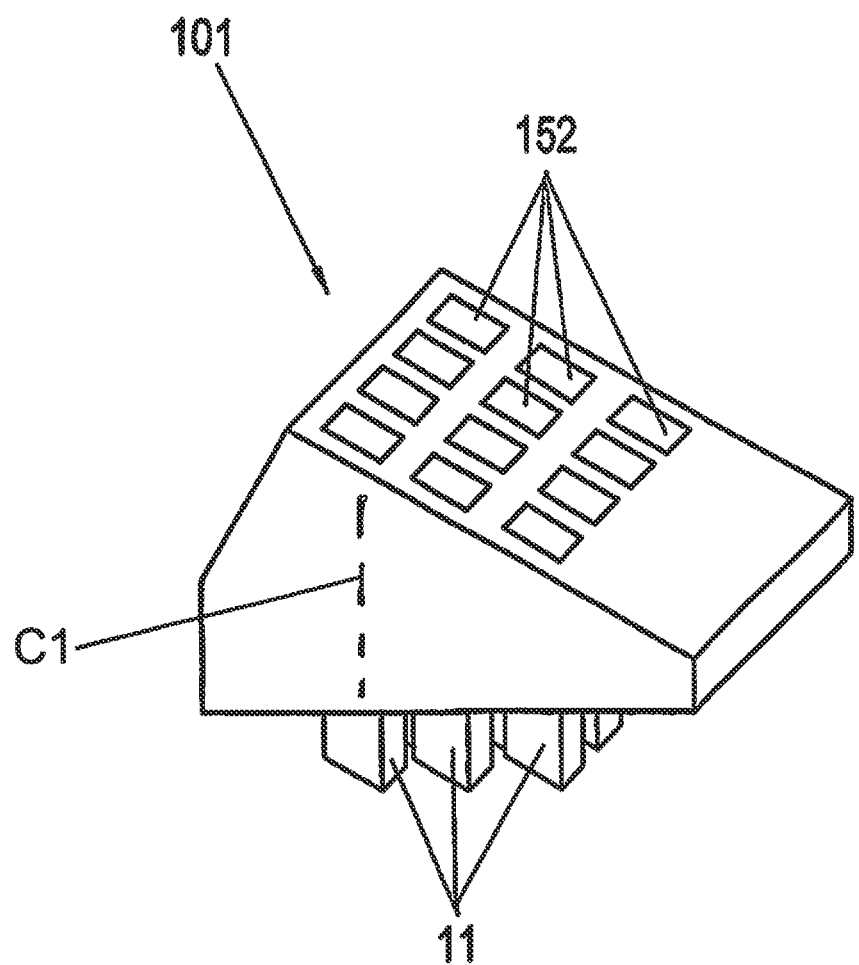

FIG. 9 shows the lower adapter part 101 of FIG. 5*a*. It includes the first intermediate terminals 152, which are provided for contacting the first intermediate plug terminals 151 of the second adapter part 102. Here, these are developed as socket connectors. In addition, it presents the first connectors 11, which contact the plug-in connections/bus lines of the electronics assembly 3.

The number, arrangement and development as socket connectors and/or connectors of the first and second connectors 11, 12 and mating connectors 31, 22 as well as the first and second plug intermediate terminals 151, 212 and mating connectors 152 or intermediate contexts 213 can be changed depending on the switching operation to be realized.

FIGS. 6*a*-6*f*

Figure 6A:
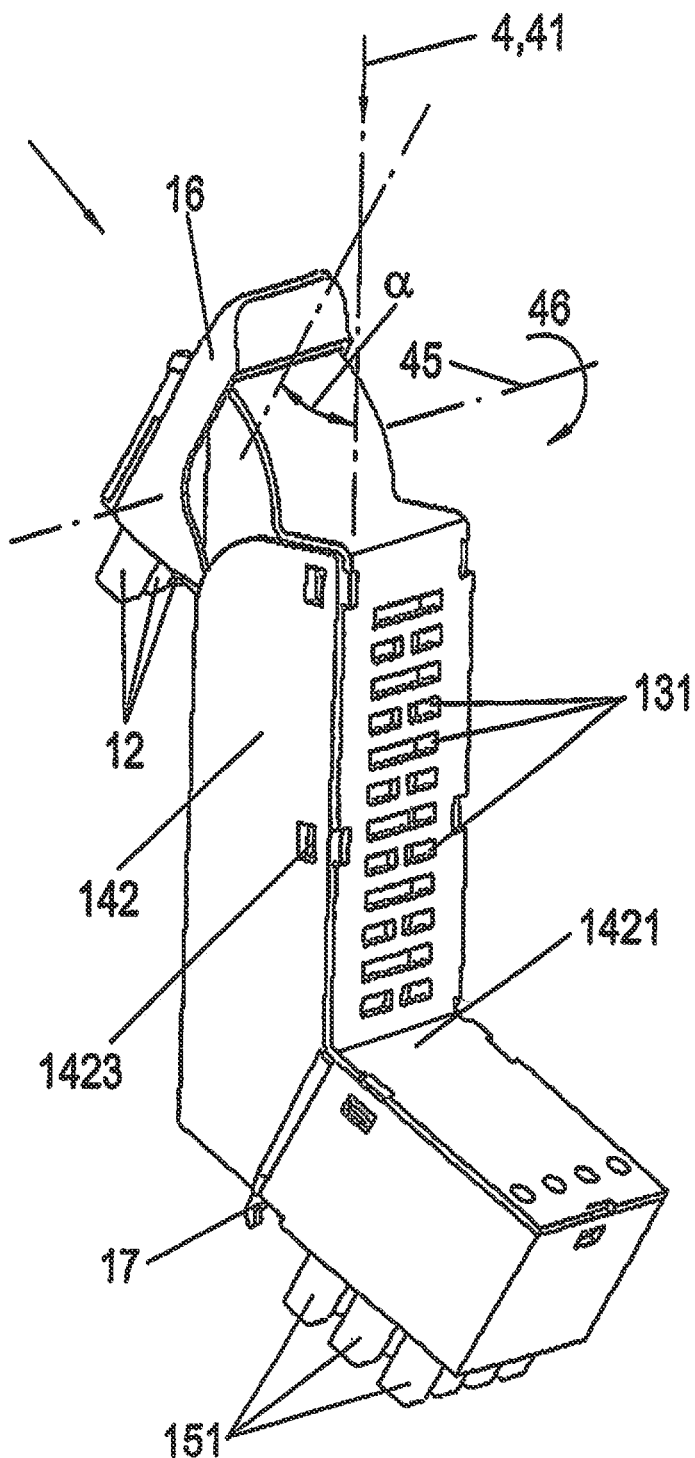

According to a modification of the upper adapter part 102' shown in FIGS. 6*a*-6*f*, only a single horizontal row of upper terminals 12 at the same height is provided. As a result, a multitude of vent slots 131 can be arranged on the plug-in side 47 of the second adapter part 102', through which the electronics module 2 can be ventilated particularly well. This is shown in FIGS. 6*c* and 6*d*, wherein FIG. 6*c* shows the plug-in side 47 and FIG. 6*d* shows the rear 48 of the second adapter part 102'.

FIGS. 6*e* and 6*f* show the second adapter housing part 142 that is developed as a frame part without the adapter interior member 1421, so that an interior chamber 1420 of the second adapter housing part 142 can be seen. As a result, the insulation or screening means 1424 that are developed as contact studs are visible which extend into the interior 1420. FIGS. 7a-7h and FIGS. 8a-8d

In the embodiment shown in FIG. 8a, in addition to the two-section adapter 1" including the upper section 102" and lower section 101", an auxiliary adapter section 21 is connected between the upper section 102' and the electronics module 2. Consequently the distance A between these components is increased, and that in addition to or alternatively to changing the plug-in direction and/or interconnection can be used for connecting additional electronics components. The distance A is determined by a width of the intermediate adapter component 21. By changing the distance A between the connection module 2 and the second adapter part 102, other plug-in connections 3711 of the first connection bus 371 are contacted. For this purpose, the intermediate adapter component 21 has one or multiple second mating terminals 212, into which the second connectors 12 of the upper adapter section 102 can be inserted. The second mating adapters 212 are electrically connected with second intermediate contacts 213, which extend at an angle that is 90° here to the second connectors 12 and which can be electrically connected to the second connectors 22 of the electronics module 2.

Figure 7H:
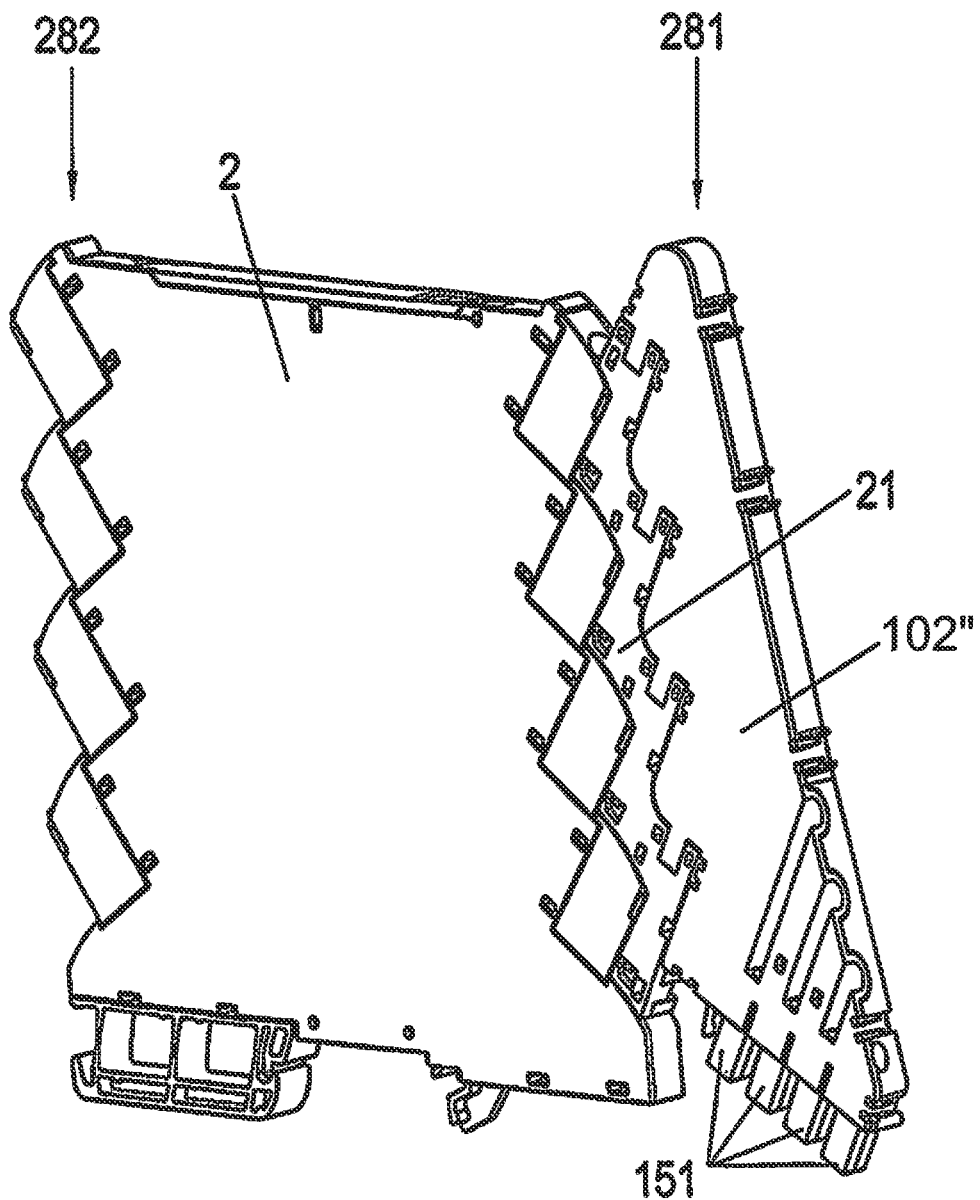
FIG. 7h is a perspective view illustrating the manner of assembling the components of FIGS. 7a and 7c upon an electronic module.

FIGS. 7a and 7b show the intermediate adapter component 21 with the second mating connectors 212 that are developed as socket connectors here and the second intermediate contacts 213 that are developed as contact plates here, as a perspective view and a lateral view. FIGS. 7c and 7d show the second adapter part 102 as a perspective view and a lateral view. FIGS. 7e and 7f show a perspective and a lateral view of the intermediate module 21 that is arranged on the second adapter part 102. FIG. 7g shows the connection module 2, the intermediate module 21, and the second adapter part 102 as an exploded view, and FIG. 7h shows a perspective view of an assembled arrangement of the intermediate module 21 with the second adapter part 102 on the connection module 2.

Figure 8B:
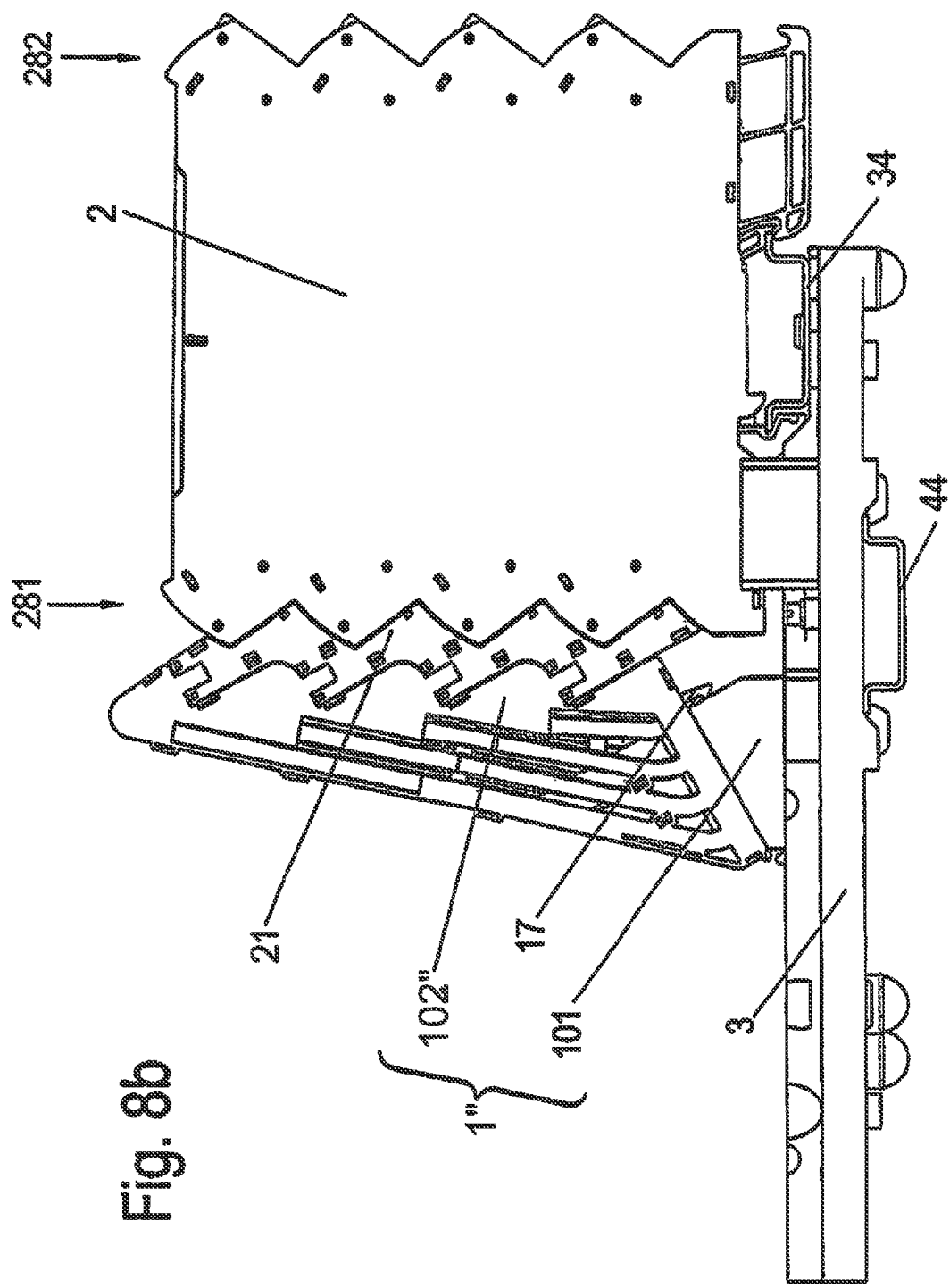

FIG. 8a shows the arrangement of the FIG. 7g mounted on the electronics assembly 3. With this embodiment other plug-in connections/bus lines of the electronics assembly 3 are contacted, due to the changed distance A because of the intermediate adapter component 21. Here too, FIG. 8c shows a side view, in which the rear 48 of adapter 1 is visible, and FIG. 8d shows a lateral view, in which the front end of the connection module 2 is visible. FIG. 8b shows how the second adapter part 102" is attached on the first adapter part 101" by means of the snap hook 17.

While in accordance with the provisions of the Patent Statutes the preferred forms and embodiments of the invention have been illustrated and described, it will be apparent to those skilled in the art that changes may be made without deviating from the invention described above.

What is claimed is:

1. A connector arrangement for electrically connecting an electronics module with a printed circuit board assembly, comprising:
   (a) a horizontal general-planar printed circuit board assembly (3) including at least one upwardly directed first contact (31; 371);
   (b) a vertical generally-rectangular electronics module (2) mounted on said printed circuit board assembly, said electronics module having a first end (281) provided with at least one generally upwardly directed second contact (22); and
   (c) adapter means (1) mounted on said electronics module first end for electrically connecting together said printed circuit board and said electronics module, said adapter means including a rigid housing (14) formed of insulating material, said adapter means housing containing at least one generally vertical conductor (C) having:
      (1) a lower end connected by a vertical lower terminal (11) with said printed circuit board assembly first contact and
      (2) an upper end connected by an upper terminal (12) with said electronics module second contact, said adapter upper terminal and said electronics module second contact each being inclined by an acute angle (α) relative to the vertical;
   (d) module mounting rail means (34) for mounting said electronics module on said printed circuit board assembly; and
   (e) bus bar means (35) arranged in said electronics mounting rail for supplying electrical energy to each first contact (31) on said printed circuit board assembly.

2. A connector arrangement as defined in claim 1, and further including:
   (f) partition means (32) defining a plurality of slots (33) on the upper surface of said printed circuit board assembly for arranging a plurality of said electronic modules in side-by-side relation on said module mounting rail.

3. A connector arrangement as defined in claim 2, wherein a plurality of said first contacts (31) are arranged in the bottom portions of said slots (33), respectively.

4. A connector arrangement as defined in claim 3, wherein said adapter means includes at least two vertically-spaced rows of said upper terminals (12) arranged for engagement with corresponding contacts on said electronics module.

5. A connector arrangement for electrically connecting an electronics module with a printed circuit board assembly, comprising:
   (a) a horizontal general-planar printed circuit board assembly (3) including at least one upwardly directed first contact (31; 3711);
   (b) a vertical generally-rectangular electronics module (2) mounted on said printed circuit board assembly, said electronics module having a first end (281) provided with at least one generally upwardly directed second contact (22); and
   (c) adapter means (1) mounted on said electronics module first end for electrically connecting together said printed circuit board and said electronics module, said adapter means including a rigid housing (14) formed of insulating material, said adapter means housing containing at least one generally vertical conductor (C) having:
      (1) a lower end connected by a vertical lower terminal (11) with said printed circuit board assembly first contact and
      (2) an upper end connected by an upper terminal (12) with said electronics module second contact, said adapter upper terminal and said electronics module second contact each being inclined by an acute angle (α) relative to the vertical;
   (d) and further wherein adjacent surfaces of said adapter means housing and said electronics module contain opposed cooling vents (13, 23).

6. A connector arrangement as defined in claim 5, and further including:
   (e) latch means (24) for fastening said electronics module to said module mounting rail; and (f) release means (25) for releasing said latch means, thereby to permit removal of said module from said module mounting rail.

7. A connector arrangement for electrically connecting an electronics module with a printed circuit board assembly, comprising:
   (a) a horizontal general-planar printed circuit board assembly (3) including at least one upwardly directed first contact (31; 3711);
   (b) a vertical generally-rectangular electronics module (2) mounted on said printed circuit board assembly, said electronics module having a first end (281) provided with at least one generally upwardly directed second contact (22);
   (c) adapter means (1) mounted on said electronics module first end for electrically connecting together said printed circuit board and said electronics module, said adapter means including a rigid housing (14) formed of insulating material, said adapter means housing containing at least one generally vertical conductor (C) having:
      (1) a lower end connected by a vertical lower terminal (11) with said printed circuit board assembly first contact and
      (2) an upper end connected by an upper terminal (12) with said electronics module second contact, said adapter upper terminal and said electronics module second contact each being inclined by an acute angle ($\alpha$) relative to the vertical; and
   (d) module mounting rail means (34) for mounting said electronics module on said printed circuit board assembly;
   (e) said adapter means being sectional and including:
      (1) a lower section (101) carrying a lower section ($C_1$) of said conductor means and said lower terminals (11);
      (2) an upper section (102) carrying said upper terminals (12) and an upper section ($C_2$) of said conductor means; and
      (3) lower intermediate terminals (152) and upper intermediate terminals (151) connecting together the upper and lower ends of said lower and upper conductor sections, respectively, said lower and upper intermediate terminals being oriented at said acute angle ($\alpha$) relative to the vertical.

8. A connector arrangement as defined in claim 7, wherein each of said upper terminals (12) and said upper intermediate terminals (151) comprises a male terminal including a pair of resilient contacts.

9. A connector arrangement as defined in claim 7, wherein said adapter housing upper section is generally L-shaped, thereby defining a generally-vertical upper portion and a generally horizontal lower portion.

10. A connector arrangement as defined in claim 9, wherein said housing upper section carries a plurality of vertically spaced horizontal rows of said upper terminals (12).

11. A connector arrangement as defined in claim 9, wherein said upper housing section contains a single horizontal row of said upper terminals (12).

12. A connector arrangement as defined in claim 9, and further including:
   (f) release lever means (16) pivotally connected with the upper end of said housing upper section, said release lever means being operable to cooperate with said electronics module to release said adapter upper housing section from said module.

13. A connector arrangement as defined in claim 7, wherein said adapter means further includes:
   (3) an auxiliary adapter section (21) connected between said adapter upper section and said electronics module, thereby to vary the distance (A) between said lower adapter section and said mounting rail, said auxiliary adapter section having first auxiliary terminals (212) connected with said second terminal (12), and second auxiliary terminals (213) connected with said module second contacts (22).

14. A connector arrangement as defined in claim 1, wherein said acute angle ($\alpha$) is between 20° and 70°.

15. A connector arrangement as defined in claim 14, wherein said acute angle ($\alpha$) is between 30° and 50°.

16. A connector arrangement for electrically connecting an electronics module with a printed circuit board assembly, comprising:
   (a) a horizontal general-planar printed circuit board assembly (3) including at least one upwardly directed first contact (31; 371);
   (b) a vertical generally-rectangular electronics module (2) mounted on said printed circuit board assembly, said electronics module having a first end (281) provided with at least one generally upwardly directed second contact (22);
   (c) adapter means (1) mounted on said electronics module first end for electrically connecting together said printed circuit board and said electronics module, said adapter means including a rigid housing (14) formed of insulating material, said adapter means housing containing at least one generally vertical conductor (C) having:
      (1) a lower end connected by a vertical lower terminal (11) with said printed circuit board assembly first contact and
      (2) an upper end connected by an upper terminal (12) with said electronics module second contact, said adapter upper terminal and said electronics module second contact each being inclined by an acute angle ($\alpha$) relative to the vertical;
   (d) module mounting rail means (34) for mounting said electronics module on said printed circuit board assembly; and
   (e) main mounting rail means (44) adapted for mounting said printed circuit board assembly on a fixed support.

* * * * *